(12) United States Patent
Iwai et al.

(10) Patent No.: US 8,675,431 B2
(45) Date of Patent: Mar. 18, 2014

(54) SEMICONDUCTOR MEMORY DEVICE AND DEFECTIVE CELL RELIEVING METHOD

(75) Inventors: Takayuki Iwai, Setagaya-ku (JP); Makoto Takahashi, Yokohama (JP); Masaharu Wada, Yokohama (JP); Mariko Iizuka, Yokohama (JP); Kimimasa Imai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

(21) Appl. No.: 13/425,364

(22) Filed: Mar. 20, 2012

(65) Prior Publication Data
US 2013/0051167 A1 Feb. 28, 2013

(30) Foreign Application Priority Data
Aug. 31, 2011 (JP) ................................. 2011-188096

(51) Int. Cl.
*G11C 29/00* (2006.01)
(52) U.S. Cl.
USPC ......................................... 365/200; 365/201
(58) Field of Classification Search
USPC ............................................... 365/200, 201
See application file for complete search history.

(56) References Cited

U.S. PATENT DOCUMENTS

| 5,134,616 A * | 7/1992 | Barth et al. ................... 714/711 |
| 2003/0014687 A1 * | 1/2003 | Wu .................................... 714/7 |
| 2009/0213634 A1 * | 8/2009 | Shibata ........................... 365/51 |

FOREIGN PATENT DOCUMENTS

JP 2006-186247 7/2006

* cited by examiner

*Primary Examiner* — Michael Tran
(74) *Attorney, Agent, or Firm* — Knobbe, Martens, Olson & Bear LLP

(57) ABSTRACT

A memory cell array of a first semiconductor chip includes a normal cell array and a spare cell array. A first defect address data output circuit outputs first defect address data indicating an address of a defective memory cell in the memory cell array. A first comparison circuit compares address data with the first defect address data and outputs a first match signal in case of matching. A second defect address data output circuit outputs second defect address data indicating an address of a defective memory cell in the memory cell array. A second comparison circuit compares the address data with the second defect address data and outputs a second match signal in case of matching.

20 Claims, 23 Drawing Sheets

US 8,675,431 B2

SEMICONDUCTOR MEMORY DEVICE AND DEFECTIVE CELL RELIEVING METHOD

CROSS REFERENCE TO RELATED APPLICATIONS

This application is based on and claims the benefit of priority from prior Japanese Patent Application No. 2011-188096, filed on Aug. 31, 2011, the entire contents of which are incorporated herein by reference.

FIELD

Embodiments described herein relate generally to a semiconductor device and a defective cell relieving method.

BACKGROUND

In recent years, multi-chip modules (MCM) formed by stacking a plurality of semiconductor chips on a substrate have been gaining more and more importance. The MCM technique allows plural types of semiconductor chips manufactured by different manufacturing processes to be stacked on one substrate and formed as one module. For example, it is possible to manufacture chips including a logic circuit (logic chips) and chips including a semiconductor memory device (memory chips) by different manufacturing processes respectively. Then, after passing them through a test process, it is possible to combine different types of non-defective chips to form one module. This process can achieve a higher yield than that achieved when forming a logic circuit and a circuit including a memory on one substrate by a series of manufacturing processes.

However, the problem of this process is that if an after-wafer-level defect occurs during a packaging process or after the packaging process due to a thermal stress or the like, such a defect cannot be relieved, resulting in defective products and a yield drop.

DETAILED DESCRIPTION

The semiconductor device according to the embodiments to be described below includes a first semiconductor chip including a semiconductor memory device and provided in a package, and a second semiconductor chip including a control circuit configured to control the semiconductor memory device and provided in the package.

The first semiconductor chip includes a memory cell array, a first defect address data output circuit, a first comparison circuit, and a decoder. The memory cell array includes a normal cell array configured by arranging memory cells at the intersections of a plurality of first lines and a plurality of second lines, and a spare cell array configured by arranging spare cells for replacing the normal cell array. The first defect address data output circuit outputs first defect address data indicating the address of a defective memory cell in the memory cell array.

The first comparison circuit compares address data indicating the address of a memory cell with the first defect address data to output a first match signal in case of matching.

The decoder decodes the address data and selects the memory cell in the normal cell array, or when the first match signal is output, selects a first spare cell in the spare cell array instead of the memory cell in the normal cell array.

The second semiconductor chip includes a control circuit, a second defect address data output circuit, and a second comparison circuit. The control circuit controls the operation of the first semiconductor chip. The second defect address data output circuit outputs second defect address data indicating the address of a defective memory in the memory cell array. The second comparison circuit compares the address data with the second defect address data and outputs a second match signal in case of matching. The decoder is configured to select a second spare cell in the spare cell array when the second match signal is output.

The embodiments of the present invention will now be explained in detail with reference to the drawings.

First Embodiment

Figure 1A:
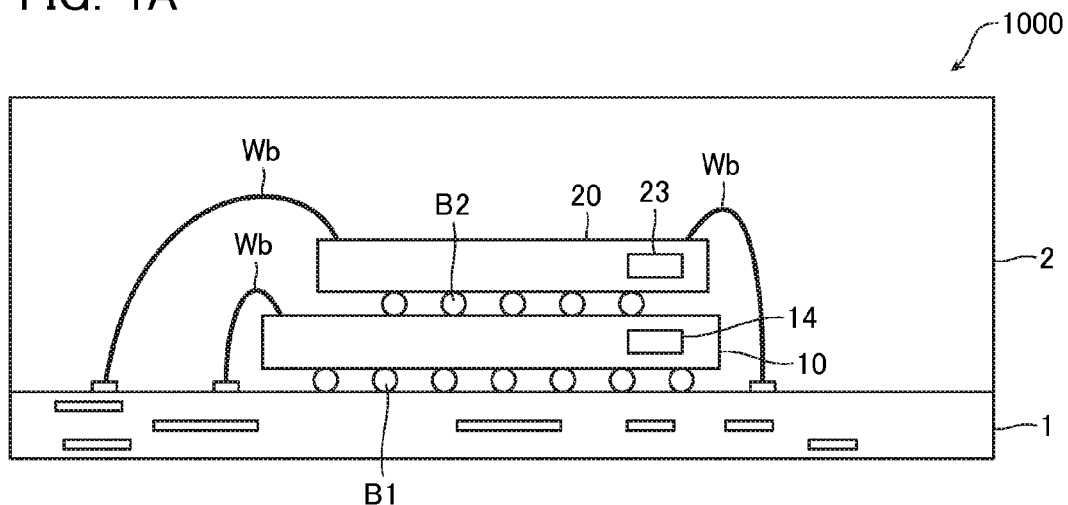
FIG. 1A is a schematic diagram showing the whole configuration of a semiconductor device 1000 according to a first embodiment.

FIG. 1A is a schematic diagram showing the whole configuration of a semiconductor device 1000 according to the first embodiment. For example, the semiconductor device 1000 according to the present embodiment is a multi-chip module (MCM) formed by mounting a memory chip 10 and a logic chip 20 on a principal surface of a package substrate 1 in their bare chip state so as to be stacked in this order, and covering them with a sealing resin 2. The memory chip 10 is a semiconductor chip including a semiconductor memory device (memory circuit), and the logic chip 20 is a semiconductor chip including a memory controller configured to control the memory circuit.

In the semiconductor device 1000, the memory circuit in the memory chip 10 is tested before packaging. According to the result of the test, address data of a defective memory cell is written into a fuse circuit 14 in the memory chip 10. Furthermore, the semiconductor device 1000 according to the present embodiment is capable of writing address data of a defective memory cell that occurs during packaging or after packaging into a fuse circuit 23 (Fuse Block (eFuse)) in the logic chip 20 after packaging is completed. This can improve the redundancy rate and the yield.

The package substrate 1 is a multilayer interconnect substrate made of a glass epoxy resin or the like, and multilayer interconnections are formed thereon and therein in several layers.

In FIG. 1A, the memory chip 10 is mounted on the package substrate 1 through solder bumps B1. The solder bumps B1 electrically connect the multilayer interconnections in the package substrate 1 and the terminals of the memory chip 10.

Figure 1B:
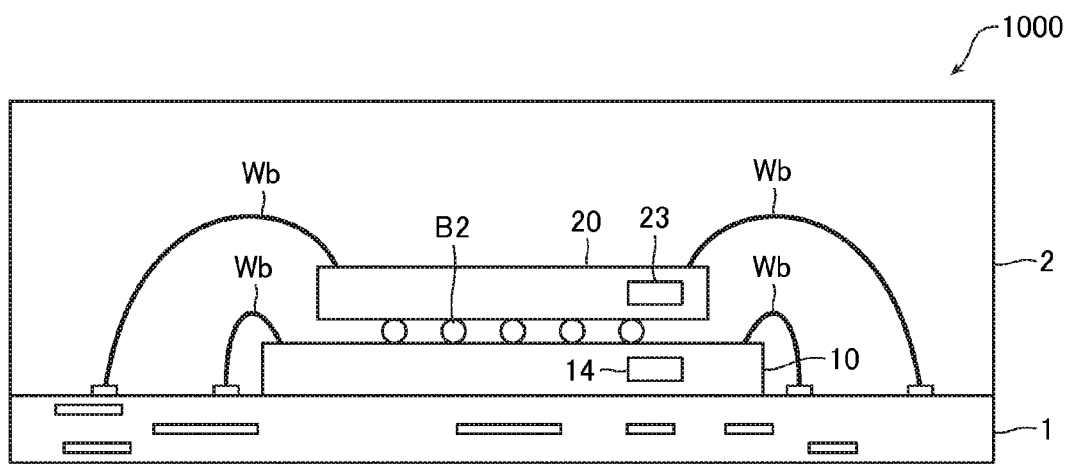
FIG. 1B is a schematic diagram showing another example of the whole configuration of the semiconductor device 1000 according to the first embodiment.

The logic chip 20 is stacked on the upper surface of the memory chip 10 through solder bumps B2. As shown in FIG. 1A, the memory chip 10 and the logic chip 20 can be electrically connected to the package substrate 1 by wire bonding Wb. The MCM shown in FIG. 1A is merely one example, and it is also possible to employ a configuration in which the memory chip 10 and the logic chip 20 are both formed on the package substrate 1 in parallel and the memory chip 10 and the logic chip 20 are connected only by wire bonding. Moreover, the embodiments to be described below can be applied to a semiconductor device having a configuration in which the memory chip 10 and the logic chip 20 packaged with the sealing resin 2 individually are disposed on a printed substrate. In FIG. 1A, the memory chip 10 is electrically connected to the substrate 1 through the semiconductor bumps B1 formed in through-silicon vias. However, it is also possible to employ a configuration shown in FIG. 1B in which no through-silicon vias are used and the memory chip 10 and the substrate 1 are connected only by wire bonding Wb. Furthermore, it is also possible to connect the memory chip 10 and the logic chip 20 by a wireless communication means instead of a physical electric connection means using a conductive material.

Figure 2:
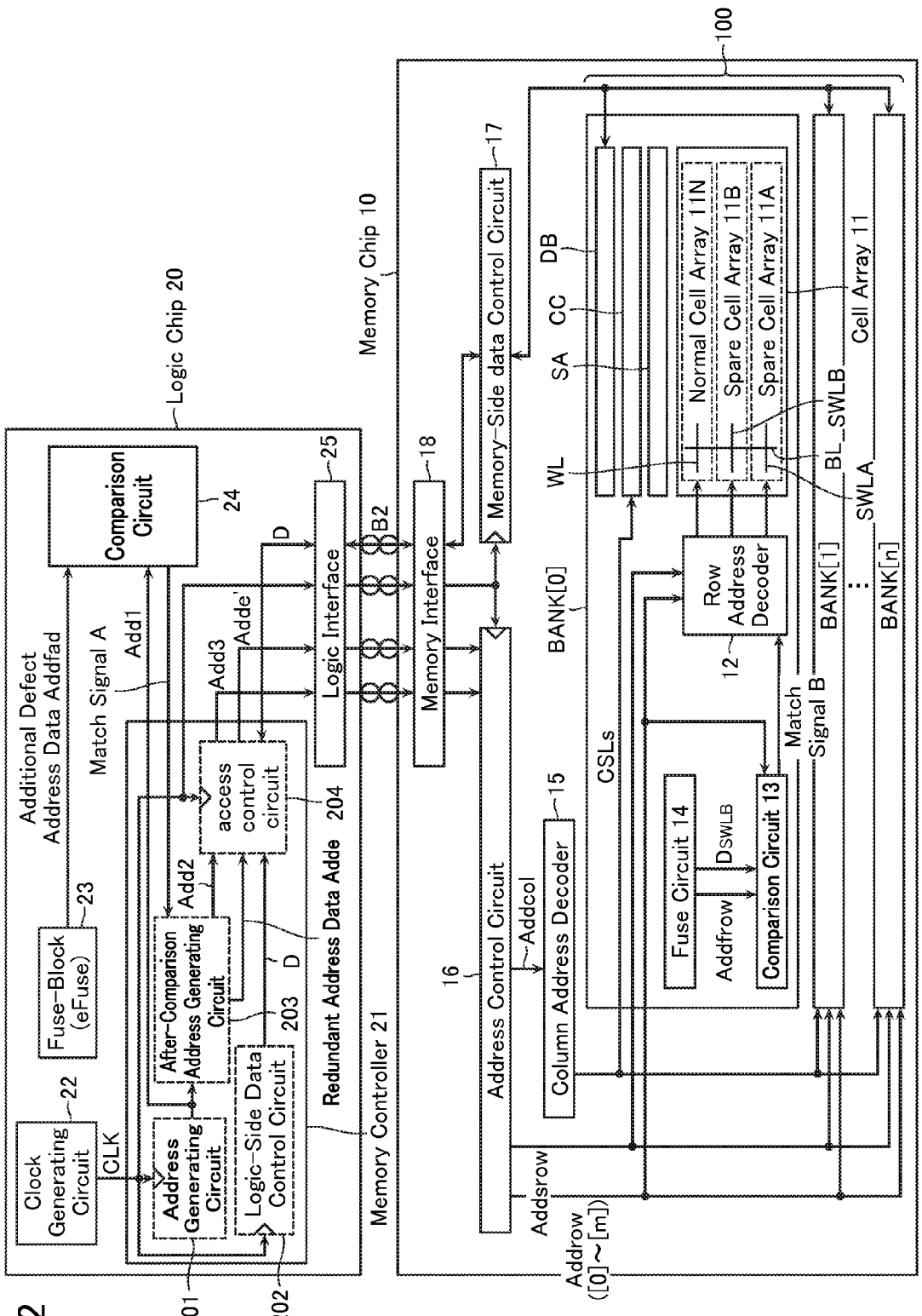
FIG. 2 is a block diagram showing an example of specific configurations of a memory chip 10 and a logic chip 20 included in the semiconductor device 1000 according to the first embodiment.

FIG. 2 is a block diagram showing an example of specific configurations of the memory chip 10 and the logic chip 20. As shown in FIG. 2, the memory chip 10 includes a memory circuit 100. The memory circuit 100 is divided into a plurality of banks BANK[0] to BANK[n]. Each of the banks BANK[0] to BANK[n] includes a memory cell array 11, a row address decoder 12, a comparison circuit 13, and a fuse circuit 14.

The memory cell array 11 is, for example, a DRAM (Dynamic Random Access Memory), and configured by arranging DRAM memory cells (for example, 1T1C cells formed of a capacitor and a transistor) at the intersections of bit lines BL and word lines WL.

The memory cell array 11 includes a normal cell array 11N for storing data, and spare cell arrays 11A and 11B for replacing defective cells in the normal cell array 11N. Here, explanation will be given by taking, for example, a case where a defective cell detected during a wafer process before a packaging process is replaced by the spare cell array 11B, and a defective cell detected during or after a packaging process is replaced by the spare cell array 11A. However, the present invention is not limited to this case.

It is only necessary that the two spare cell arrays 11A and 11B be divided into individual address spaces, and it is not necessary that these spare cell arrays be divided physically. For example, it is possible to employ a configuration in which spare cell arrays SWLA and SWLB are arranged physically alternately.

A sense amplifier circuit SA configured to sense and amplify the potentials of the bit lines BL, a column control circuit CC configured to control the potentials of the bit lines BL, and a data buffer DB configured to temporarily retain data read out by the sense amplifier circuit SA are provided on the extended lines of the bit lines BL of the memory cell array 11.

The fuse circuit 14 retains defective row address data Addfrow indicating the address of a word line WL connected to a defective cell in the normal cell array 11N. The fuse circuit 14 also retains information (spare word line usage information $D_{SWLB}$) indicating whether each one of the plurality of spare word lines SWLB in the spare cell array 11B is used or not. The spare word line usage information $D_{SWLB}$ corresponds to the defective row address data Addfrow.

The comparison circuit 13 has a function of comparing row address data Addrow indicating the address of a word line WL to be accessed and spare row address data Addsrow with defective row address data Addfrow written in the fuse circuit 14. The spare row address data Addsrow is data indicating that the address of a defective cell has been given designated by an address data in the logic chip 20, and is data for indicating the address of a spare word line SWLA in the spare cell array 11A. That is, address data (additional defect address data) Addfad of a defective cell detected during or after a packaging process is stored in the logic chip 20. The spare row address data Addsrow becomes "1" when additional defect address data Addfad and the designated address match, and becomes "0" otherwise.

When the row address data Addrow and defective row address data Addfrow match, the comparison circuit 13 generates and outputs a match signal B="1". When the spare row address data Addsrow is "1", the comparison circuit 13 outputs a match signal B by setting it to B="0".

The row address decoder 12 receives and decodes the row address data Addrow, the spare row address data Adds row, and the match signal B, and selects a word line WL in the normal cell array 11N or a spare word line SWLA or SWLB in the spare cell array 11A or 11B and the memory cells connected to such a word line. As will be described later, row address data Addrow and spare row address data Addsrow are generated based on address data sent from the logic chip 20.

The memory chip 10 includes a column address decoder 15, an address control circuit 16, a memory-side data control circuit 17, and a memory interface 18 which are provided commonly for the plurality of banks BANK.

The column address decoder 15 outputs a column selecting signal CSLs in accordance with column address data Addcol received from the address control circuit 16. The address control circuit 16 receives address data Add3 and redundant address data Adde' from the logic chip 20 through the memory interface 18, generates row address data Addrow[0] to Addrow[m], spare row address data Addsrow, and column address data Addcol based on the received data, and outputs them.

The memory-side data control circuit 17 has a function of feeding data D supplied from the logic chip 20 to the memory cell array 11 as write data, and conversely feeding data read out from the memory cell array 11 to the logic chip 20 as read-out data.

The memory interface 18 is in charge of sending and receiving address data and write/read-out data D to be exchanged between the logic chip 20 and the memory chip 10.

Next, a specific configuration of the logic chip 20 will be explained. The logic chip 20 includes a memory controller 21, a clock generating circuit 22, a fuse circuit 23, a comparison circuit 24, and a logic interface 25.

The logic chip 20 is configured to be capable of storing the address of a defective memory cell which occurs in the memory cell array 11 during or after a packaging process of the memory chip 10 and logic chip 20 in the fuse circuit 23 as additional defect address data Addfad. The comparison circuit 24 compares additional defect address data Addfad stored in the fuse circuit 23 with address data Add1 supplied from the memory controller 21, and outputs a match signal A when both the signals match. The match signal A is sent to the memory controller 21.

The memory controller 21 has a function of supplying address data, command data, and data D to be written into the memory cell array 11 to the memory chip 10 and thereby controlling the memory chip 10. The memory controller 21 further includes an address generating circuit 201, a logic-side data control circuit 202, an after-comparison address generating circuit 203, and an access control circuit 204.

The address generating circuit 201 generates address data Add1 in accordance with address data received from an unillustrated host device or the like. The logic-side data control circuit 202 generates data D including data to be written into the memory cell array 11, etc. based on data received from an unillustrated host device or the like.

The after-comparison address generating circuit 203 converts the address data Add1 based on the match signal A and thereby outputs address data Add2 and redundant address data Adde. When the address data Add1 doesn't match additional defect address data Addfad, the address data Add1 is used as it is as the address data Add2. When the address data Add1 matches additional defect address data Addfad, the address data Add1 is converted to address data Add2 indicating an address in the spare cell array 11A of the memory cell array 11. The redundant address data Adde is one-bit data which becomes "1" when it is confirmed that additional defect address data Addfad matches the address data Add1, and becomes "0" otherwise.

The access control circuit 204 receives the address data Add2, the redundant address data Adde, and the data D, and supplies address data Add3 corresponding to the address data Add2, redundant address data Adde' corresponding to the redundant address data Adde, and the data D to the memory chip 10 through the logic interface 25 and the memory interface 18 at a certain timing. The data D having passed through the memory interface 18 is transferred by the memory-side data control circuit 17 in synchronization with a clock CLK, and sent to the memory cell array 11 of each bank BANK[0] to BANK[n]. The address data Add3 and the redundant address data Adde' are controlled by the address control circuit 16 in the memory chip 10 in synchronization with the clock CLK.

The clock generating circuit 22 generates the clock CLK, and supplies it to the address generating circuit 201, the logic-side data control circuit 202, and the access control circuit 204, and to the address control circuit 16 and the memory-side data control circuit 17. The address generating circuit 201, the logic-side data control circuit 202, and the access control circuit 204 operate at the timings defined by the clock CLK.

Figure 3A:
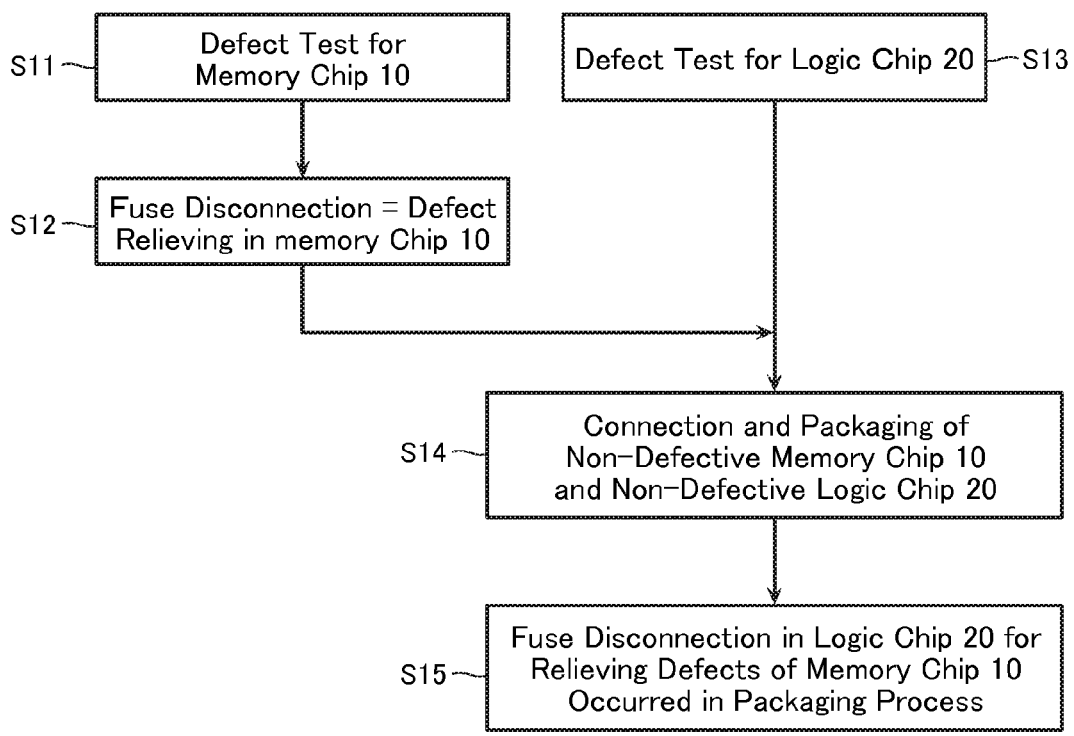
FIG. 3A explains a defective cell relieving procedure of the semiconductor device 1000 according to the first embodiment.

Next, a defective cell relieving procedure of the semiconductor device 1000 according to the present embodiment will be explained with reference to FIG. 3A. Presence or absence of defective memory cell in the memory cell array 11 in the memory chip 10 included in the semiconductor device 1000 is checked in a stage which is before a packaging process is carried out and in which memory chips 10 have not yet been diced from the wafer (wafer process) (S11). When presence of a defective cell is identified in this test in the wafer process, the address of this defective cell (defective row address data Addfrow) is stored in the fuse circuit 14 by fuse disconnection or the like in the fuse circuit 14 (S12).

In parallel with this, a defect test for the various circuits constituting the logic chip 20 is performed (S13). In this way, a memory chip 10 having undergone the defect test (and a defect relieving operation) and a logic chip 20 likewise having undergone the defect test are mounted on one package substrate 1, electrically connected through the solder bumps B1 and B2, the wire bonding Wb, etc., and then packaged by the sealing resin 2 (S14). Thereby, the semiconductor device 1000 is completed. A defective cell might occur while the packaging process of S14 is carried out or after the packaging process is completed.

In the present embodiment, a defect test for the memory cell array 11 is performed after packaging is completed, in order to relieve after-wafer-level defective cells which might occur during or after the packaging process (S15). The address of a defective cell detected in such an after-wafer-level test is stored in the fuse circuit 23 of the logic chip 20 as additional defect address data Addfad. In this way, according to the semiconductor device 1000 of the present embodiment, even if an after-wafer-level defect occurs during or after the packaging process due to a thermal stress or the like, it is possible to prevent a yield drop by relieving the defect.

Figure 3B:
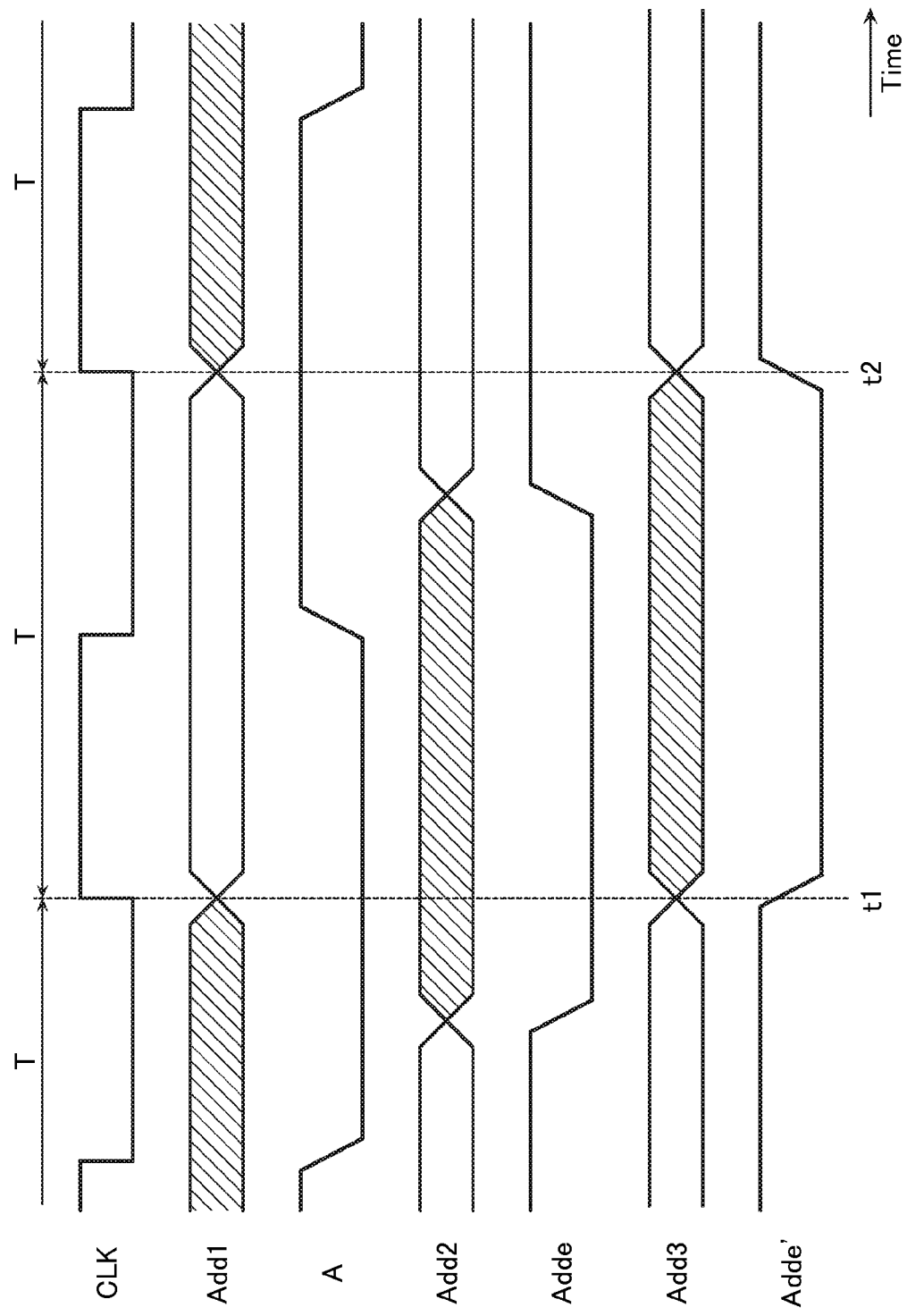
FIG. 3B is a timing chart showing an operation of the logic chip 20.

FIG. 3B is a timing chart showing operations in the logic chip 20. As shown in FIG. 3B, generation of address data Add1 by the address generating circuit 201, issuance of a match signal A by the comparison circuit 24, generation of address data Add2 and Add3 and generation of redundant address data Adde and Adde' by the after-comparison address generating circuit 203 and the access control circuit 204 are performed within one cycle (cycle T) of the clock CLK. With the operations performed in this way, the access control circuit 204 can let the comparison circuit 24 complete the comparison and issue address data Add3 and redundant address data Adde' before the timing at which the logic chip 20 accesses the memory chip 10, which can improve the operation speed.

Figure 4:
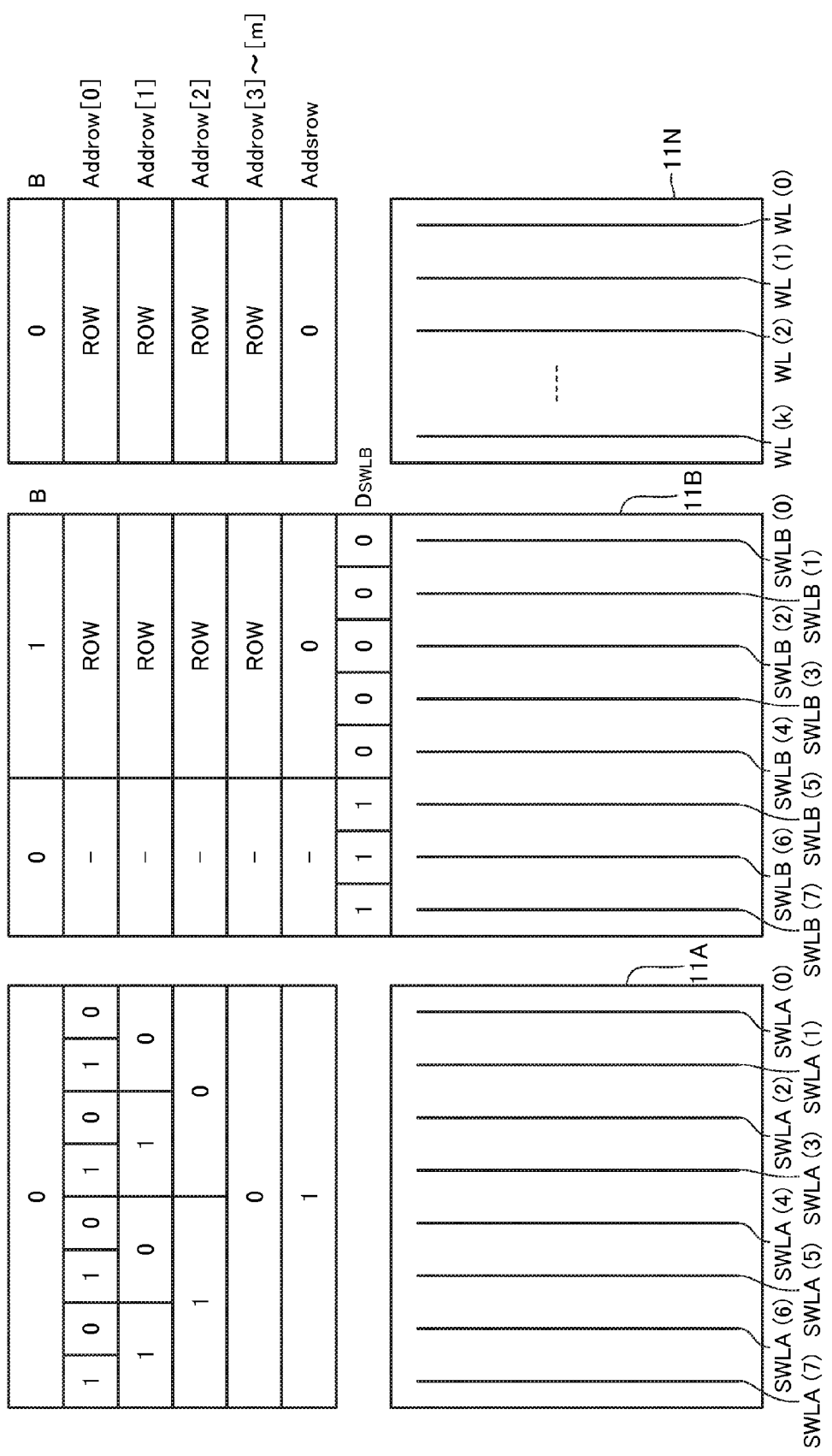
FIG. 4 shows an outline of a defect relieving procedure of a memory cell array 11 of the semiconductor device according to the first embodiment.

FIG. 4 shows an outline of a defect relieving procedure of the memory cell array 11 to be performed in accordance with row address data Addrow, spare address data Addsrow, and a match signal B. Here, explanation will be given by taking, for example, a case where the normal cell array 11 includes $k=2^{(m+1)}$ number of word lines WL(0) to WL(k), and the spare cell arrays 11A and 11B include eight spare word lines SWLA(0) to SWLA(7) and SWLB(0) to SWLB(7) respectively. As described above, the spare cell array 11A is used for relieving a defective cell that occurs during or after a packaging process, and the spare cell array 11B is used for relieving a defective cell that occurs before the packaging process (during a wafer process). Here, the number of word lines WL and the number of spare word lines SWLA and SWLB are specified for the sake of convenience of explanation, but needless to say, the present invention is not limited to cases in which any specific number of word lines are provided.

First, a defect relieving operation for defective cells detected during a wafer process will be explained. For example, assume a case where defective cells occur during a wafer process in the normal cell array 11N of a given bank BANK[j] (j=0 to n), and five word lines WL are connected to these defective cells. In this case, the addresses of these five defective word lines WL are specified in a defect test performed in the wafer process, and written into the fuse circuit 14 as defective row address data Addfrow. The five word lines WL are relieved by using, for example, five spare word lines SWLB(0) to SWLB(4) in the spare cell array 11B. The spare word lines SWLB(0) to SWLB(4) used for relieving the five defective word lines WL are assigned "0" as the spare word line usage information $D_{SWLB}$. The other unused spare word lines SWLB(5) to SWLB(7) are assigned "1" as the spare word line usage information $D_{SWLB}$. The spare word lines SWLB assigned "1" as the spare word line usage information $D_{SWLB}$ are not used for defect relieving.

In a later reading or writing operation, if a match between defective row address data Addfrow and row address data Addrow is judged by the comparison circuit 13, a match signal B="1" is output. The row address decoder 12 selects the spare word line SWLB(0) to SWLB(4) in the spare cell array 11B instead of the defective word line WL in the normal cell array 11N based on the match signal B="1", the row address data Addrow, and spare row address data Adds row.

Next, a defect relieving operation for defective cells detected during or after a packaging process will be explained. For example, assume a case where defective cells occur during or after a packaging process in the normal cell array 11N of a given bank BANK[j] (j=0 to n), and two word lines WL are connected to the defective cells. In this case, these two word lines WL are relieved by using two spare word lines SWLA (for example, SWLA(0) and SWLA(1)) in the spare cell array 11A.

In this case, the addresses of the two defective word lines WL are specified in a defect test performed after the packaging process, and written into the fuse circuit 23 as additional defect address data Addfad. In a later reading or writing operation, if a match between additional defect address data Addfad and address data Add1 is judged by the comparison circuit 24, a match signal A="1" is output by the comparison circuit 24. Based on the match signal A="1", the after-comparison address generating circuit 203 generates address data Add2 designating a spare word line SWLA in the spare memory cell array 11A, and redundant address data Adde. The access control circuit 204 outputs address data Add3 and redundant address data Adde' based on the address data Add2 and the redundant address data Adde. The address data Add3 and the redundant address data Adde' are sent to the address control circuit 16 through the logic interface 25 and the memory interface 18. The address control circuit 16 generates column address data Addcol, row address data Addrow, and spare row address data Addsrow="1" based on the address data Add3 and the redundant address data Adde'. The spare row address data Addsrow is data which is set to "0" when no match between additional defect address data Addfad and the address data Add1 is detected.

The row address decoder 12 selects a spare word line SWLA in the spare cell array 11A in accordance with the row address data Addrow and the spare row address data Adds row.

The Effect of First Embodiment

As explained above, according to the semiconductor device of the first embodiment, the result of a defect test in a wafer process is stored in the fuse circuit 14 in the memory chip 10, and thereby a defective cell that has occurred in the wafer process is relieved. Furthermore, a defective cell that has occurred during or after a packaging process is identified in a defect test performed after the packaging process. The result of the defect test is stored in the fuse circuit 23 in the logic chip 20, and compared by the comparison circuit 24 with address data designated in a later writing or reading operation. In this way, the judgment of whether a match with the address of a defective cell identified during or after a packaging process is found or not is performed by the comparison circuit 24 in the logic chip 20 different from the comparison circuit 13 in the memory chip 10. Hence, it is possible to efficiently relieve not only a defective cell that has occurred in a wafer process but also a defective cell that has occurred during or after a packaging process. Furthermore, since the logic chip 20 can judge within one cycle of the clock CLK whether a match with additional defect address data Addfad is found, it is possible to perform the judgment of match without lowering the operation speed.

Second Embodiment

Figure 5:
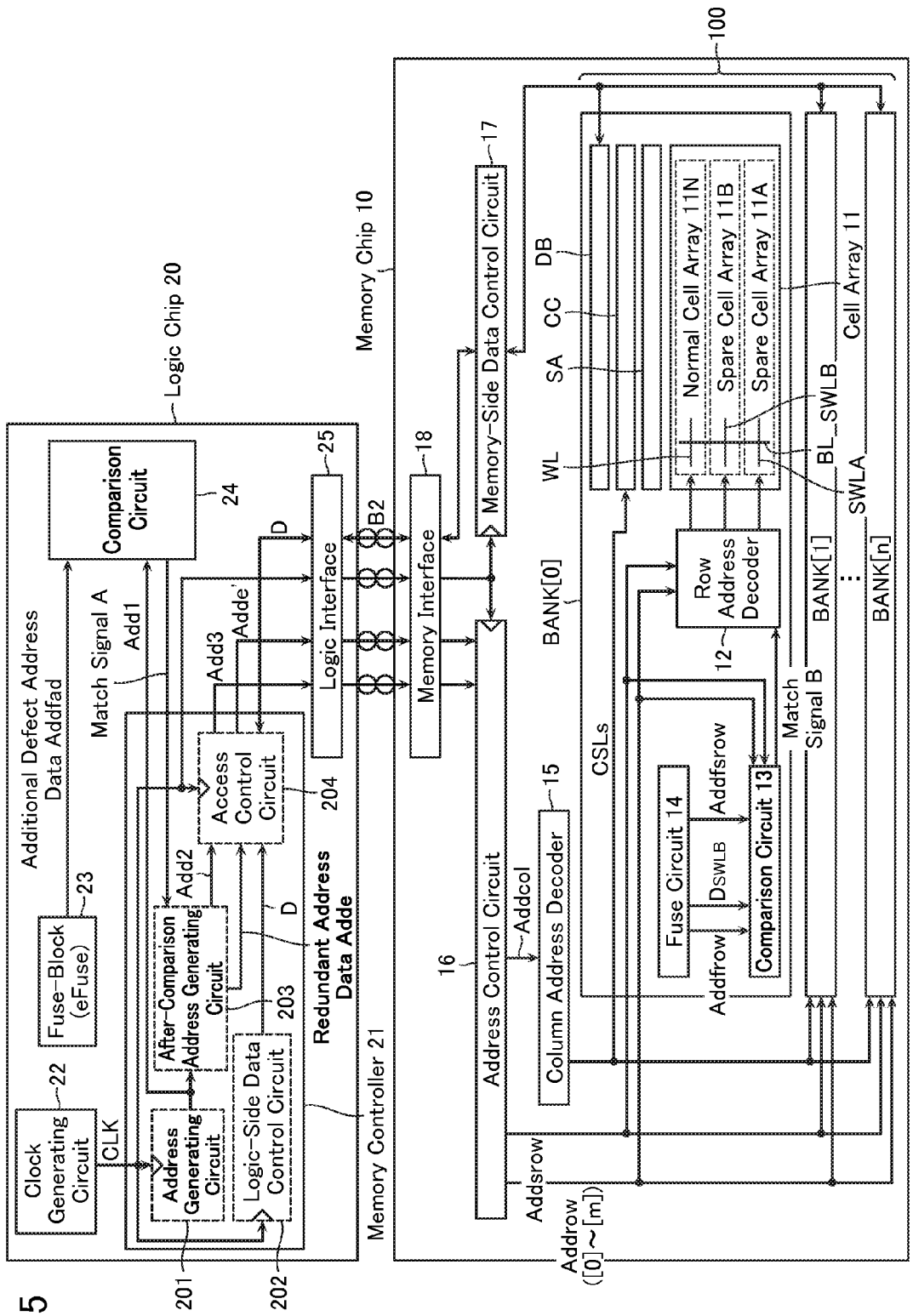
FIG. 5 is a block diagram showing an example of specific configurations of a memory chip 10 and a logic chip 20 included in a semiconductor device 1000 according to a second embodiment.
Figure 6:
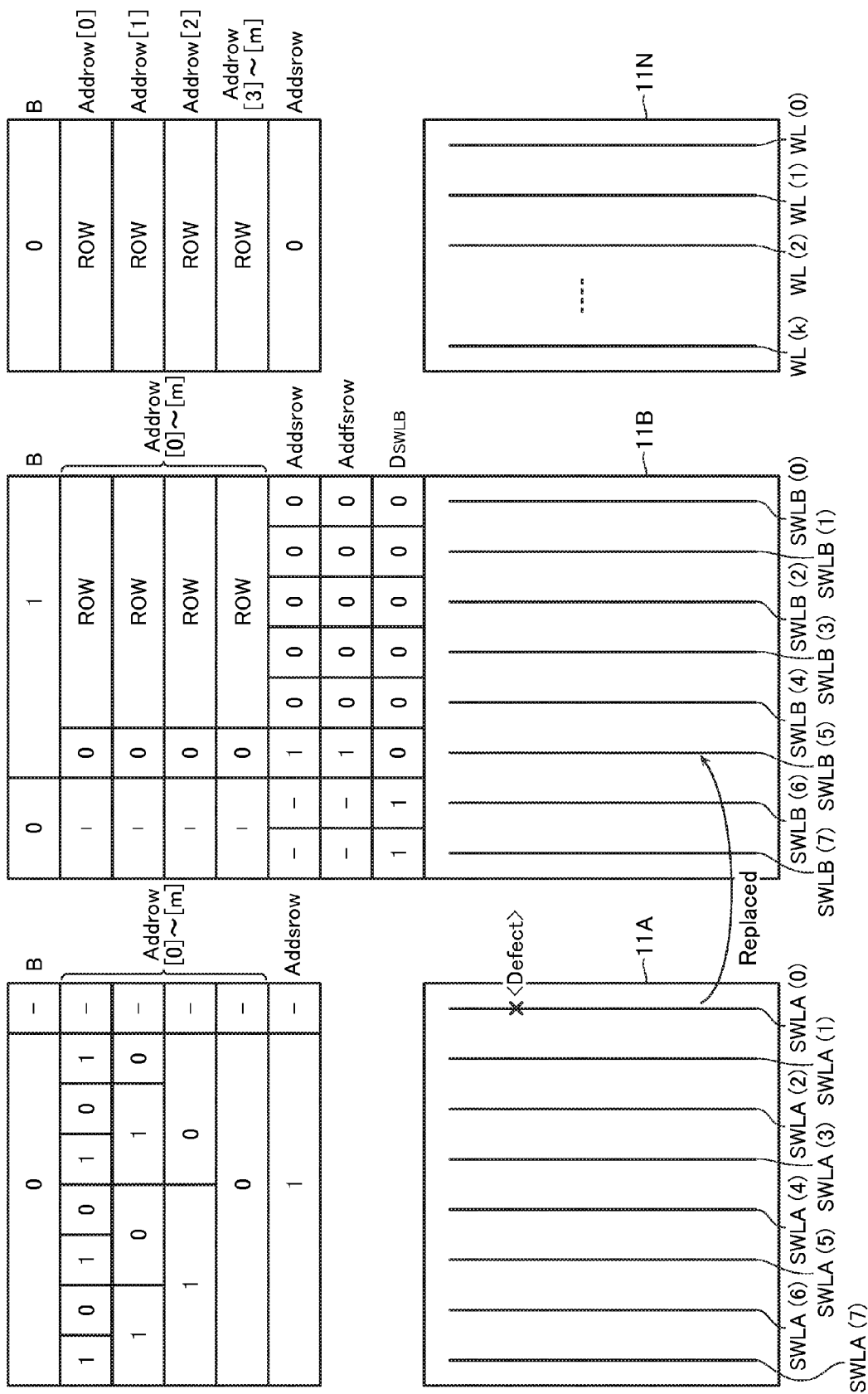
FIG. 6 shows an outline of a defect relieving procedure of a memory cell array 11 of the semiconductor device according to the second embodiment.

Next, a semiconductor device according to the second embodiment will be explained with reference to FIG. 5 and FIG. 6. The whole configuration of the present embodiment is the same as the first embodiment (FIG. 1). Furthermore, the internal configurations of the memory chip 10 and logic chip 20 are substantially the same as the first embodiment except the following point. In FIG. 5, any components that are the same as the components in FIG. 2 are denoted by the same reference numerals, and hence a detailed explanation about them will not be provided.

The second embodiment is different from the first embodiment in that when a defective spare word line WL including a defective cell occurs in the spare cell array 11A, it is relieved by another spare cell array 11B. The fuse circuit 14 stores defective spare row address data Addfsrow indicating whether a defective spare word line SWLA is present or not in the spare cell array 11A, in addition to defective row address data Addfrow and spare word line usage information $D_{SWLB}$.

Next, an outline of a defect relieving procedure according to the second embodiment will be explained with reference to FIG. 6. Here, explanation will be given by taking, for example, a case where a defect is detected in one spare word line SWLA(0) in the spare cell array 11A, and this defective spare word line SWLA(0) is replaced with a spare word line SWLB(5) in the spare cell array 11B.

The operation for accessing the normal cell array 11N and the operation for accessing the spare cell array 11B after a match with an address of a defective cell detected in a test performed in a wafer process is found are the same as in the first embodiment (FIG. 4), and hence will not be explained again.

When spare row address data Addsrow is "1", the row address decoder 12 selects the spare cell array 11A as the accessing target. However, when designated row address data Addrow indicating an address in the spare cell array 11A indicates the defective spare word line SWLA(0), the row address decoder 12 selects one of unused spare word lines SWLB in the spare cell array 11B, for example, the spare word line SWLB(5), instead of the spare word line SWLA(0). The spare word line usage information $D_{SWLB}$ of the replacing spare word line SWLB is set to "0" and not to "1".

The Effect of Second Embodiment

According to the present embodiment, it is possible to achieve the same effect as the first embodiment. Besides, it is also possible to replace a defective spare word line SWLA in the spare cell array 11A, which further improves the redundancy rate and the yield.

Third Embodiment

Figure 7:
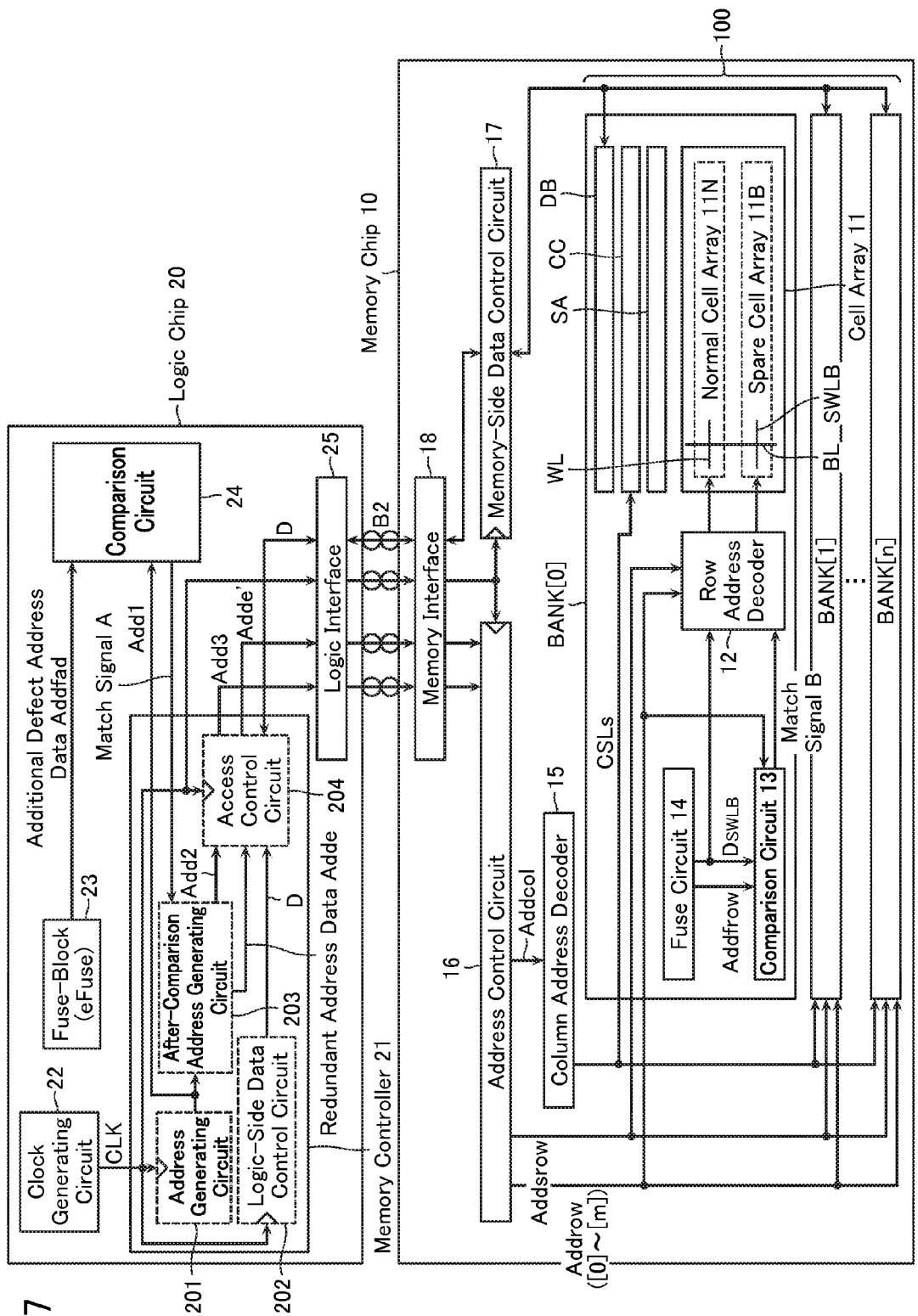
FIG. 7 is a block diagram showing an example of specific configurations of a memory chip 10 and a logic chip 20 included in a semiconductor device 1000 according to a third embodiment.

Next, a semiconductor device according to the third embodiment will be explained with reference to FIG. 7 and FIG. 8. The whole configuration of the present embodiment is the same as the first embodiment (FIG. 1). Furthermore, the internal configurations of the memory chip 10 and logic chip 20 are substantially the same as the first embodiment except the following point. In FIG. 7, any components that are the same as the components in FIG. 2 are denoted by the same reference numerals, and hence a detailed explanation about them will not be provided.

The third embodiment is different from the first embodiment in that the memory cell array 11 is constituted by a normal cell array 11N and one spare cell array 11B. A defective cell that occurs in the normal cell array 11N during a wafer process and a defective cell that occurs in the normal cell array 11N during or after a packaging process are both relieved by one spare cell array 11B.

Figure 8:
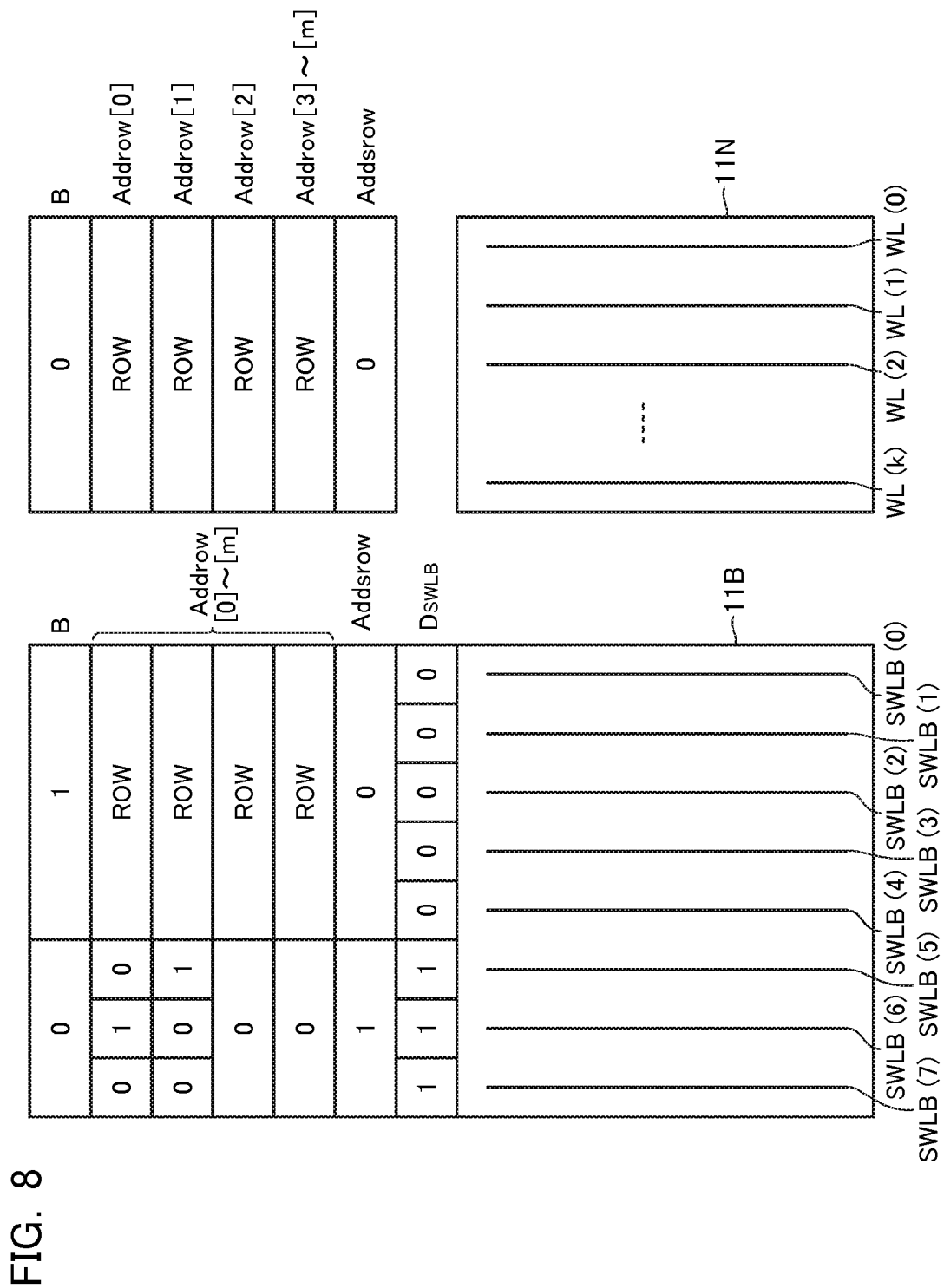
FIG. 8 shows an outline of a defect relieving procedure of a memory cell array 11 of the semiconductor device according to the third embodiment.

FIG. 8 shows an outline of a defective cell relieving procedure of a semiconductor device according to the third embodiment. Here, explanation will be given by taking, for example, a case where the normal cell array 11N includes k number of word lines WL, and the spare cell array 11B includes eight spare word lines SWLB.

First, a defect relieving operation for defective cells detected in the normal cell array 11N during a wafer process will be explained. For example, assume a case where five defective word lines WL occur in the normal cell array 11N, like in the first embodiment. In this case, the addresses of these five defective word lines WL are specified in a defect test performed in the wafer process, and written in the fuse circuit 14 as defective row address data Addfrow. These five word lines WL are relieved by using, for example, five spare word lines SWLB(0) to SWLB(4) in the spare cell array 11B. The spare word lines SWLB(0) to SWLB(4) used for relieving the five defective word lines WL are assigned "0" as the spare word line usage information $D_{SWLB}$.

In a later reading or writing operation, if a match between defective row address data Addfrow and row address data Addrow is judged by the comparison circuit 13, a match signal B="1" is output. The row address decoder 12 selects a spare word line SWLB(0) to SWLB(4) in the spare cell array 11B instead of the defective word line WL based on the match signal B="1", the row address data Addrow, and spare row address data Addsrow.

Next, a defect relieving operation for defective cells detected during or after a packaging process will be explained. For example, assume a case where defective cells occur in the normal cell array 11N during or after a packaging process, and three word lines WL are connected to these defective cells. In this case, these three word lines WL are relieved by using three spare word lines SWLB (for example, SWLB(5) to SWLB(7)) in the spare cell array 11B.

In this case, the addresses of the three defective word lines WL are specified in a defect test performed after the packaging process, and written in the fuse circuit 23 as additional defect address data Addfad. In a later reading or writing operation, if a match between additional defect address data Addfad and address data Add1 is judged by the comparison circuit 24, a match signal A="1" is output by the comparison circuit 24. Based on the match signal A="1", the after-comparison address generating circuit 203 generates address data Add2 designating a word line SWLB(5) to SWLB(7) in the spare memory cell array 11B, and redundant address data Adde. The access control circuit 204 outputs address data Add3 and redundant address data Adde' based on the address data Add2 and the redundant address data Adde. The address data Add3 and the redundant address data Adde' are sent to the address control circuit 16 through the logic interface 25 and the memory interface 18.

The address control circuit 16 generates column address data Addcol and row address data Addrow based on the address data Add3 and the redundant address data Adde', and also generates spare row address data Addsrow="1". The row address decoder 12 selects any one of the three spare word lines SWLB(5) to SWLB(7) based on the spare row address data Addsrow="1" and row address data Addrow[0] to [1]. Row address data Addrow[2] to [m] are set to "0".

Figure 9:
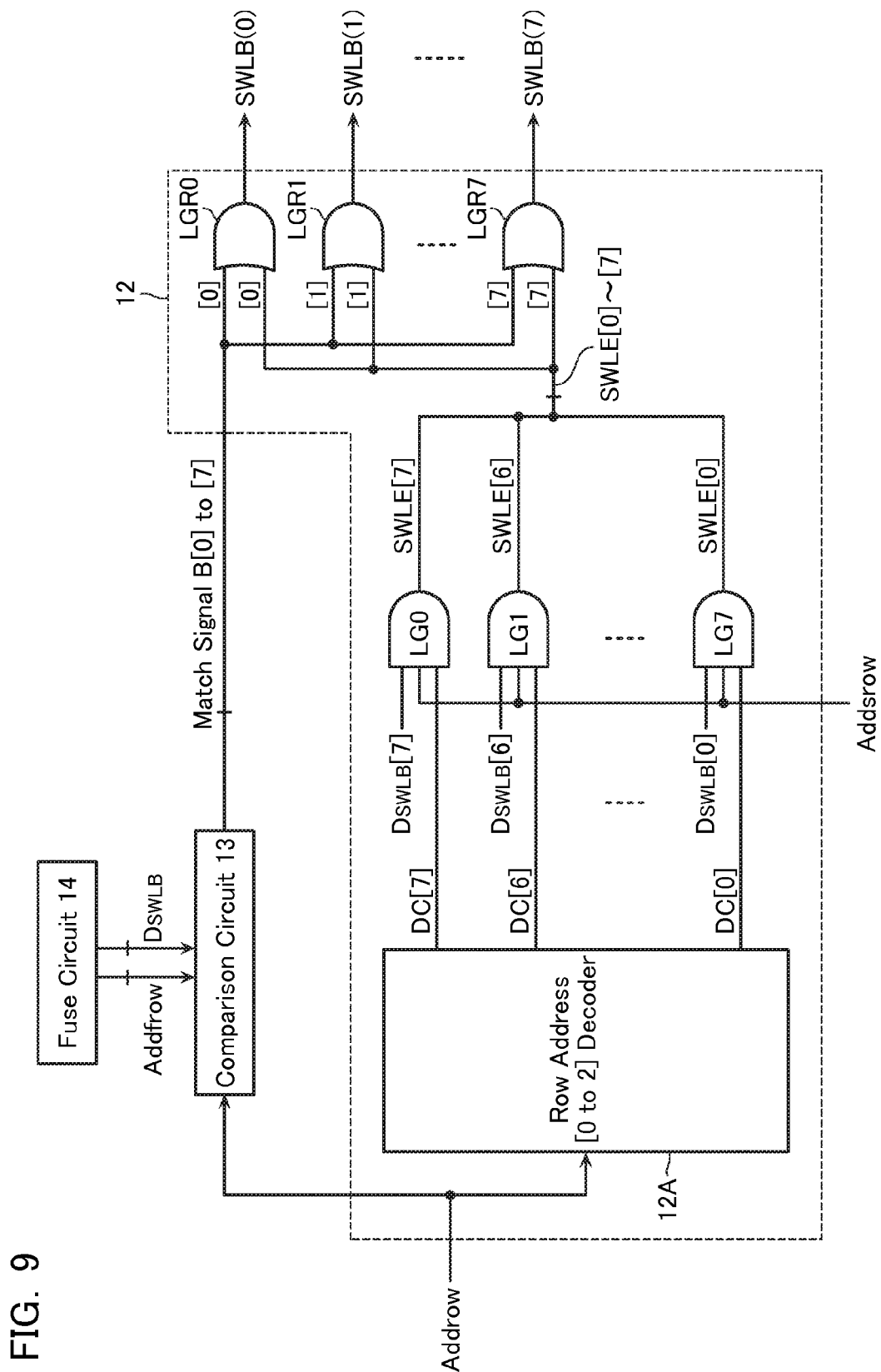
FIG. 9 shows a specific example of the configuration of a row address decoder 12 of the semiconductor device 1000 according to the third embodiment.

FIG. 9 shows an example of a specific configuration of the row address decoder 12 for realizing the defect relieving operation according to the third embodiment.

Row address data Addrow is decoded by a row address [0 to 2] decoder 12A in the row address decoder 12 and is output as a decode signal DC[0] to DC[7]. The row address [0 to 2] decoder 12A has a function of decoding three-bit row address data Addrow[0] to [2] among (m+1)-bit row address data Addrow[0] to [m] in order to select the eight spare word lines SWLB(0) to SWLB(7) in the spare cell array 11B.

The row address data Addrow is also sent to the comparison circuit 13 and compared with defective row address data Addfrow. If the row address data Addrow matches with defective row address data Addfrow, any one of match signals B[0] to B[7] that corresponds to any of the spare word lines SWLB [0] to SWLB[7] that is previously determined to be the replacer is activated.

The spare row address data Addsrow is sent to logical gates LG0 to LG7 in the row address decoder 12. The logical gates LG0 to LG7 output enable signals SWLE[0] to SWLE[7] which are the logical ANDs of the spare row address data Addsrow, the spare word line usage information $D_{SWLB}[0]$ to $D_{SWLB}[7]$ and the decode signals DC[0] to DC[7] respectively. The enable signals SWLE[0] to SWLE[7] are sent to logical gates LGR[0] to LGR[7]. The logical gates LGR[0] to LGR[7] activate or deactivate the spare word lines SWLB which are logical ORs of the match signals B[0] to B[7] and the enable signals SWLE[0] to SWLE[7] respectively.

When the spare row address data Addsrow is "1", i.e., when the address (additional defect address data Addfad) of a defective cell detected during or after a packaging process and designated address data match, all of the match signals B[0] to B[7] become "0". Hence, the enable signals SWLE[0] to SWLE[7] are output as they are from the logical gates LGR0 to LGR7 to the spare word lines SWLB(0) to SWLB (7).

On the other hand, when the spare row address data Addsrow is "0", the enable signals SWLE[0] to SWLE[7] change in accordance with the match signals B.

Fourth Embodiment

Figure 10:
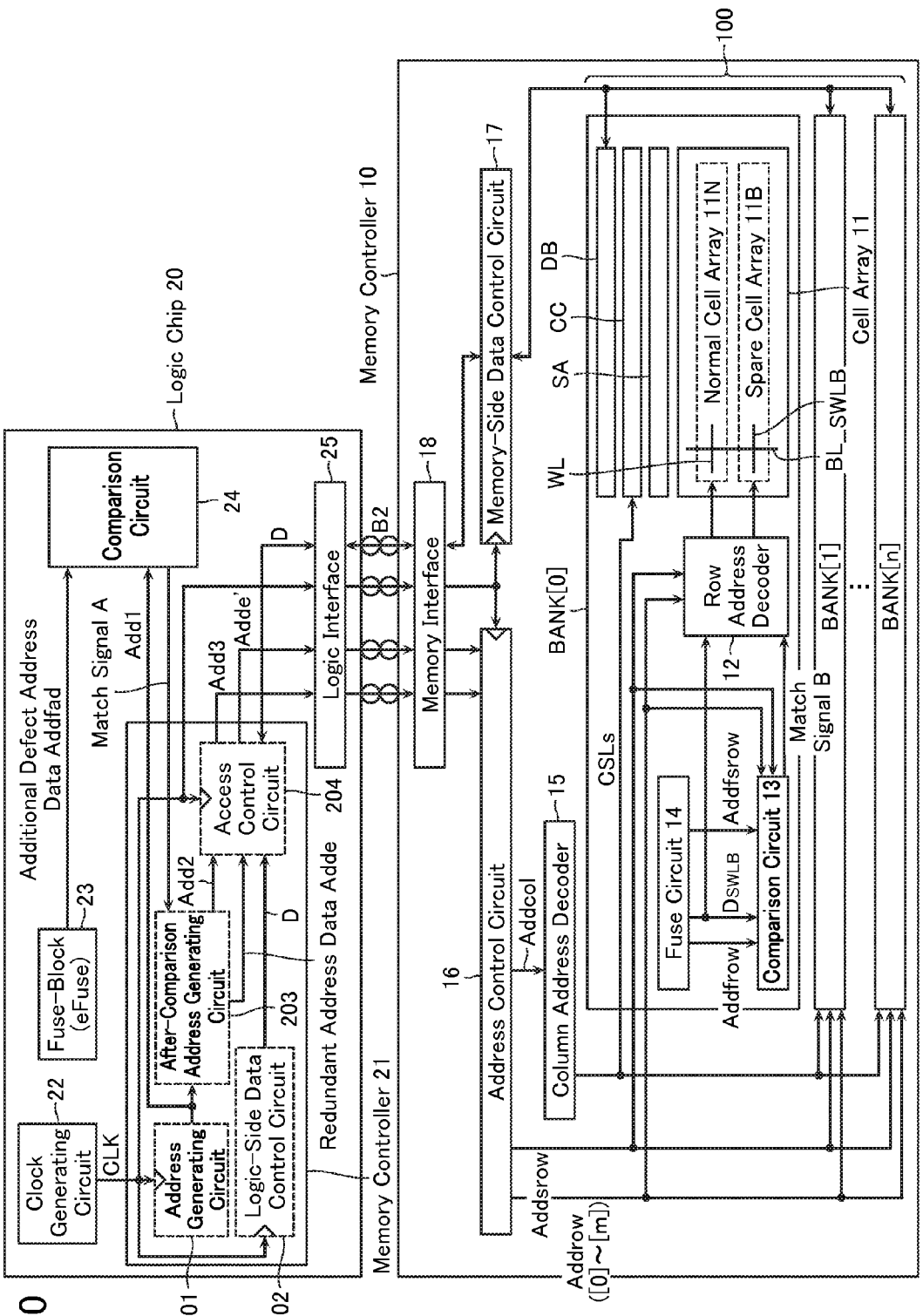
FIG. 10 is a block diagram showing an example of specific configurations of a memory chip 10 and a logic chip 20 included in a semiconductor device 1000 according to a fourth embodiment.

Next, a semiconductor device according to the fourth embodiment will be explained with reference to FIG. 10 to FIG. 12. The whole configuration of the present embodiment is the same as the first embodiment (FIG. 1). The internal configurations of the memory chip 10 and logic chip 20 are substantially the same as the configurations (FIG. 2) of the first embodiment except the flowing point. In FIG. 10, any components that are the same as the components in FIG. 2 are denoted by the same reference numerals, and hence a detailed explanation about them will not be provided below.

The fourth embodiment is the combination of the second embodiment and the third embodiment. That is, the present embodiment is the same as the second embodiment in that the fuse circuit 14 stores defective spare row address data Addfsrow, and the same as the third embodiment in that the memory cell array 11 is constituted by a normal cell array 11N and one spare cell array 11B. A defective cell that occurs in the normal cell array 11N during a wafer process and a defective cell that occurs in the normal cell array 11N during or after a packaging process are both relieved by the one spare cell array 11B. Furthermore, when a defective spare word line SWLB is detected in the spare cell array 11B, it is relieved by an unused spare word line SWLB in the same spare cell array 11B.

Figure 11:
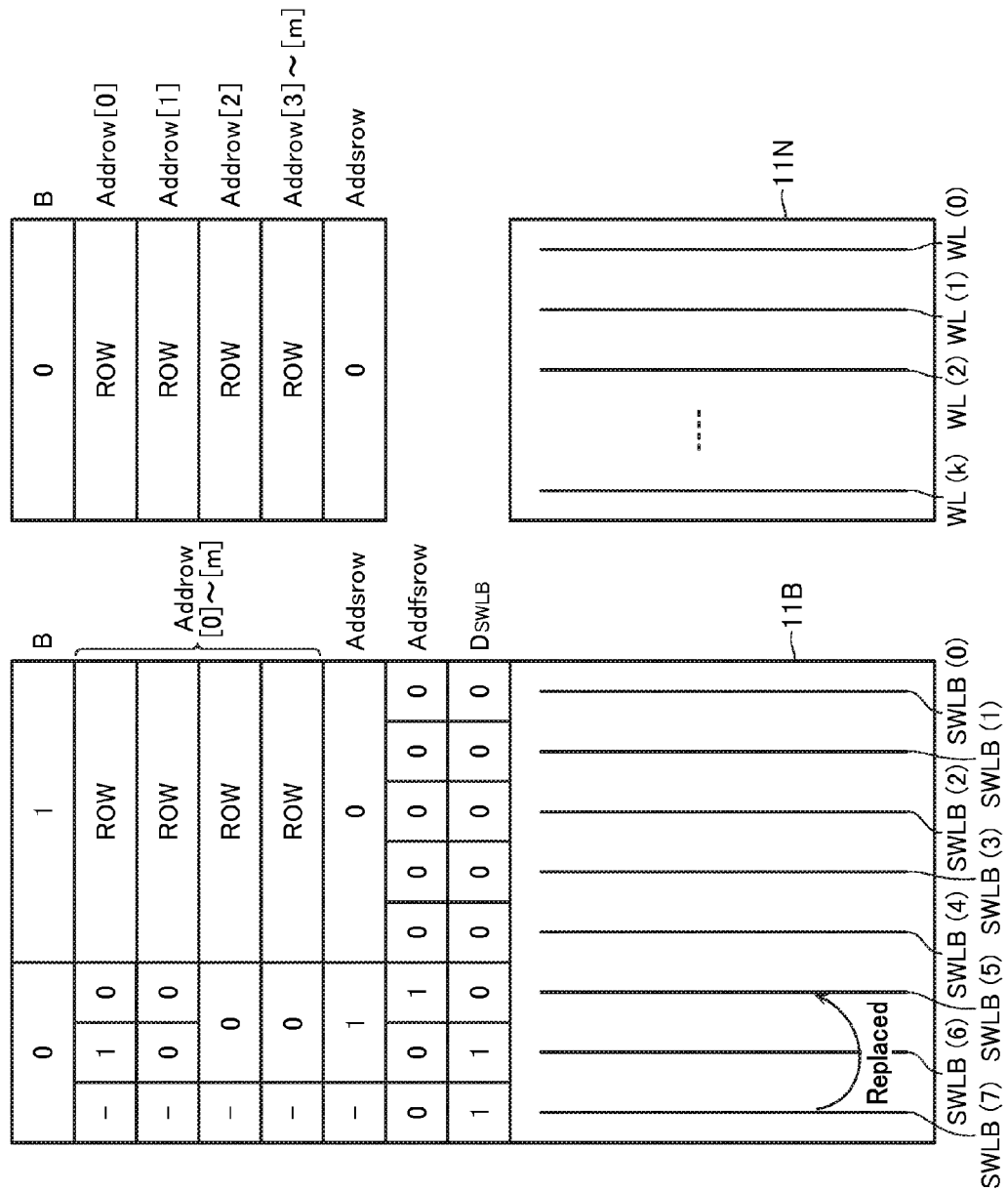
FIG. 11 shows an outline of a defect relieving procedure of a memory cell array 11 of the semiconductor device according to the fourth embodiment.

FIG. 11 shows a defect relieving method according to the fourth embodiment. Here, for example, a case where a spare word line SWLB(7) is a defective spare word line that occurs during a wafer process and is to be replaced by a spare word line SWLB(5) is shown.

A defective word line WL that occurs in the normal cell array 11N during a wafer process is relieved by a spare word line SWLB(0) to SWLB(4) in the same way as in the first to third embodiments.

On the other hand, a defective word line WL that occurs in the normal cell array 11N during or after a packaging process is replaced by a spare word line SWLB(6) to SWLB(7). However, if the spare word line SWLB(7) is defective, the row address decoder 12 selects the spare word line SWLB(5) instead of the spare word line SWLB(7) based on defective spare row address data Addfsrow. As shown in FIG. 11, the spare word line SWLB(5) is assigned "1" as defective spare row address data Addfsrow to indicate that the spare word line SWLB(5) has relieved the spare word line SWLB(7), and also assigned "0" as spare word line usage information $D_{SWLB}$.

Figure 12:
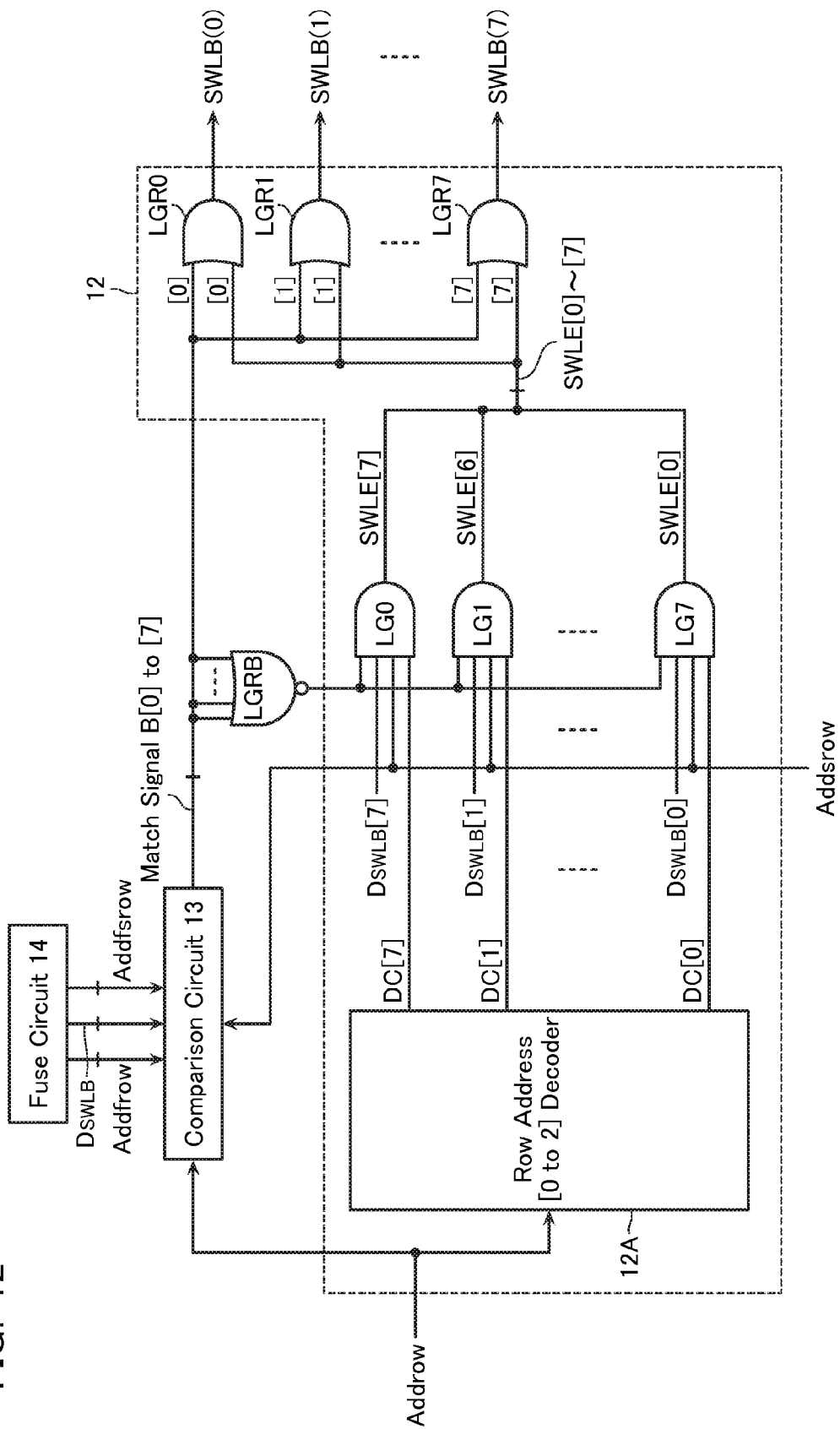
FIG. 12 shows a specific example of the configuration of a row address decoder 12 of the semiconductor device 1000 according to the fourth embodiment.

FIG. 12 shows an example of a specific configuration of the row address decoder 12 for realizing the defect relieving operation according to the fourth embodiment. This row address decoder 12 is different from the circuit of FIG. 9 in that the match signals B[0] to B[7] are input into a NOR gate LGRB, and an output signal from the NOR gate LGRB is supplied as an input signal into logical gates LG0 to LG7. That is, when any of the match signals B[0] to B[7] is "1", an output signal from the NOR gate LGRB becomes "0" to make all the enable signals SWLE[0] to SWLE[7] "0" (=disable signals). Hence, the spare word lines SWLB(0) to SWLB(7) are controlled in accordance with the match signals B[0] to B[7].

When row address data Addrow designating the spare word line SWLB(7) and spare row address data Addsrow="1" are input into the comparison circuit 13, the comparison circuit 13 judges whether or not defective row address data Addfrow and the row address data Addrow match, and after this, sets the match signal B[5] to "H" in order to designate the spare word line SWLB(5) instead of the spare word line SWLB(7) based on the defective spare row address data Addfsrow and the spare word line usage information $D_{SWLB}$. At this time, all of the enable signals SWLE[0] to SWLE[7] become "0" (=disable signals) due to the operation of the NOR gate LGRB, and hence the spare word line SWLB(5) is selected based on the match signal B[5].

Fifth Embodiment

Figure 13:
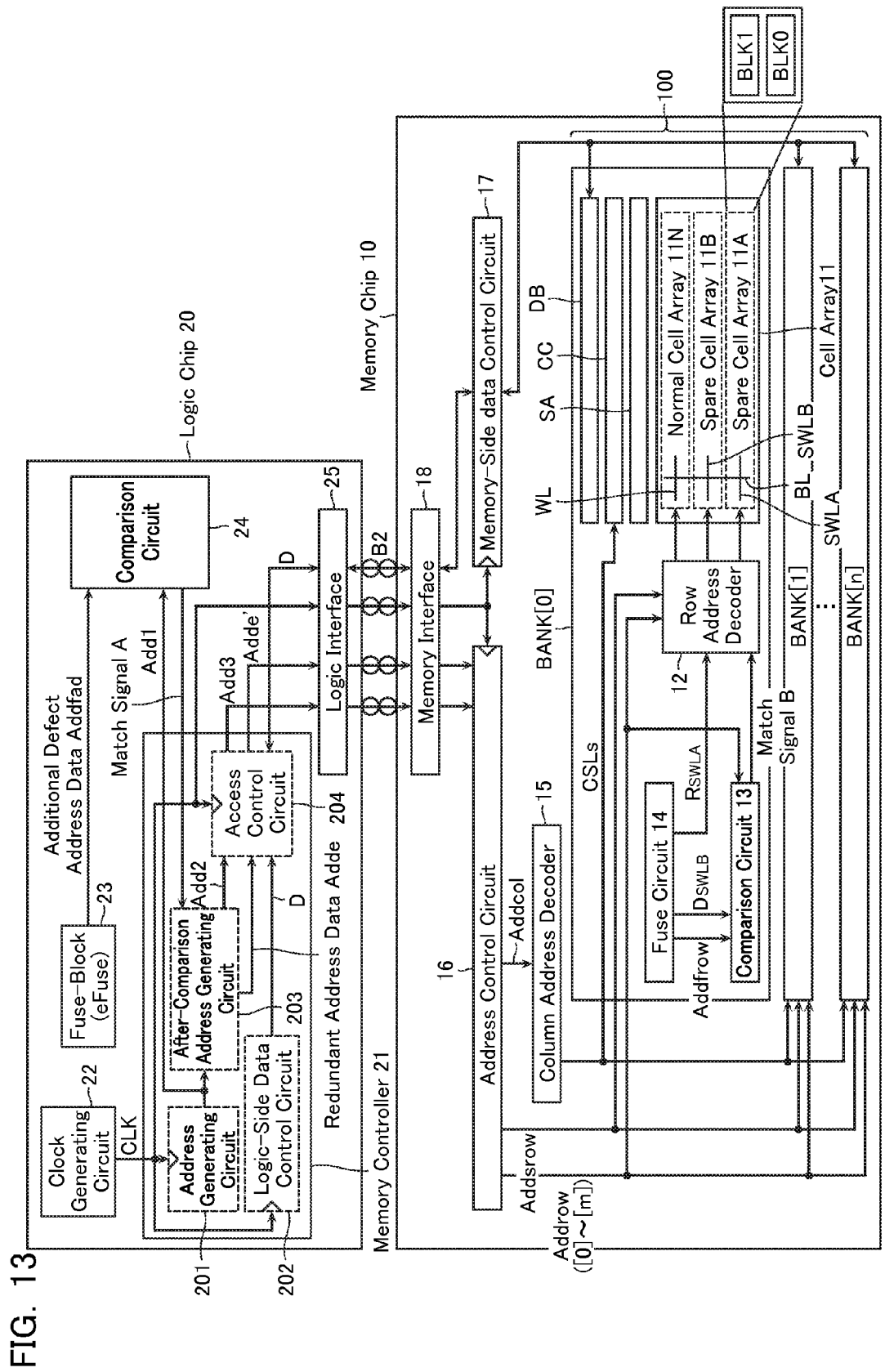
FIG. 13 is a block diagram showing an example of specific configurations of a memory chip 10 and a logic chip 20 included in a semiconductor device 1000 according to a fifth embodiment.
Figure 14:
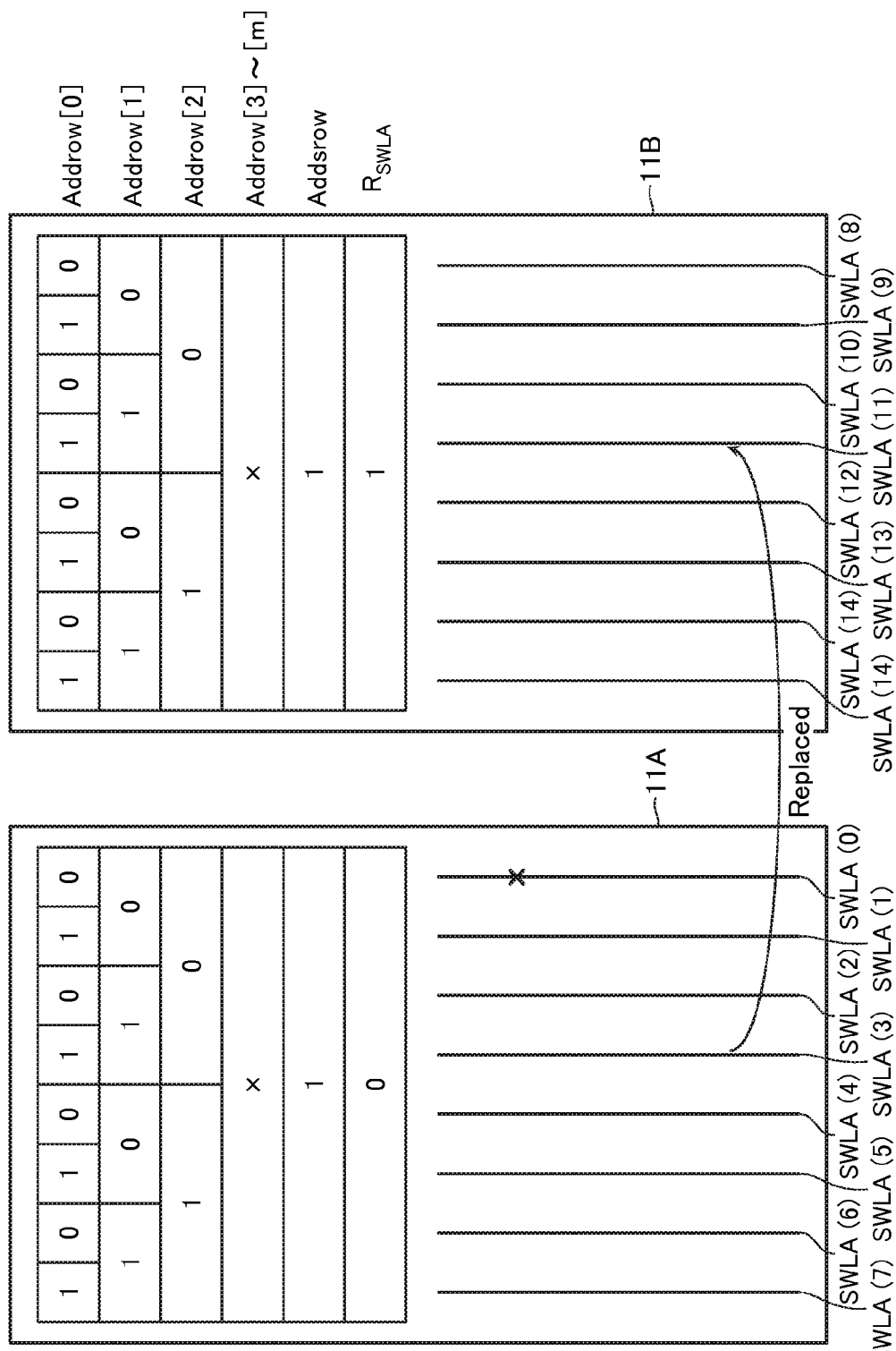
FIG. 14 shows an outline of a defect relieving procedure of a memory cell array 11 of the semiconductor device according to the fifth embodiment.

Next, a semiconductor device according to the fifth embodiment will be explained with reference to FIG. 13 and FIG. 14. The whole configuration of the present embodiment is the same as the first embodiment (FIG. 1). Furthermore, the internal configurations of the memory chip 10 and logic chip 20 are substantially the same as the first embodiment except the following point. In FIG. 13, any components that are the same as the components in FIG. 2 are denoted by the same reference numerals, and hence a detailed explanation about them will not be provided below.

In the semiconductor device according to the fifth embodiment, the spare cell array 11A is divided into a plurality of blocks BLK (for example, two blocks BLK0 and BLK1). If a defective spare word line SWLA is included in one block BLK0 of the spare cell array 11A, the block BLK0 is disposed of as a defective block, and the block BLK1 is used instead of the block BLK0 for relieving a word line WL (see FIG. 14). The fuse circuit 14 stores block replacement information $R_{SWLA}$ as information for replacing a defective block BLK0 with a non-defective block BLK1.

Sixth Embodiment

Figure 15:
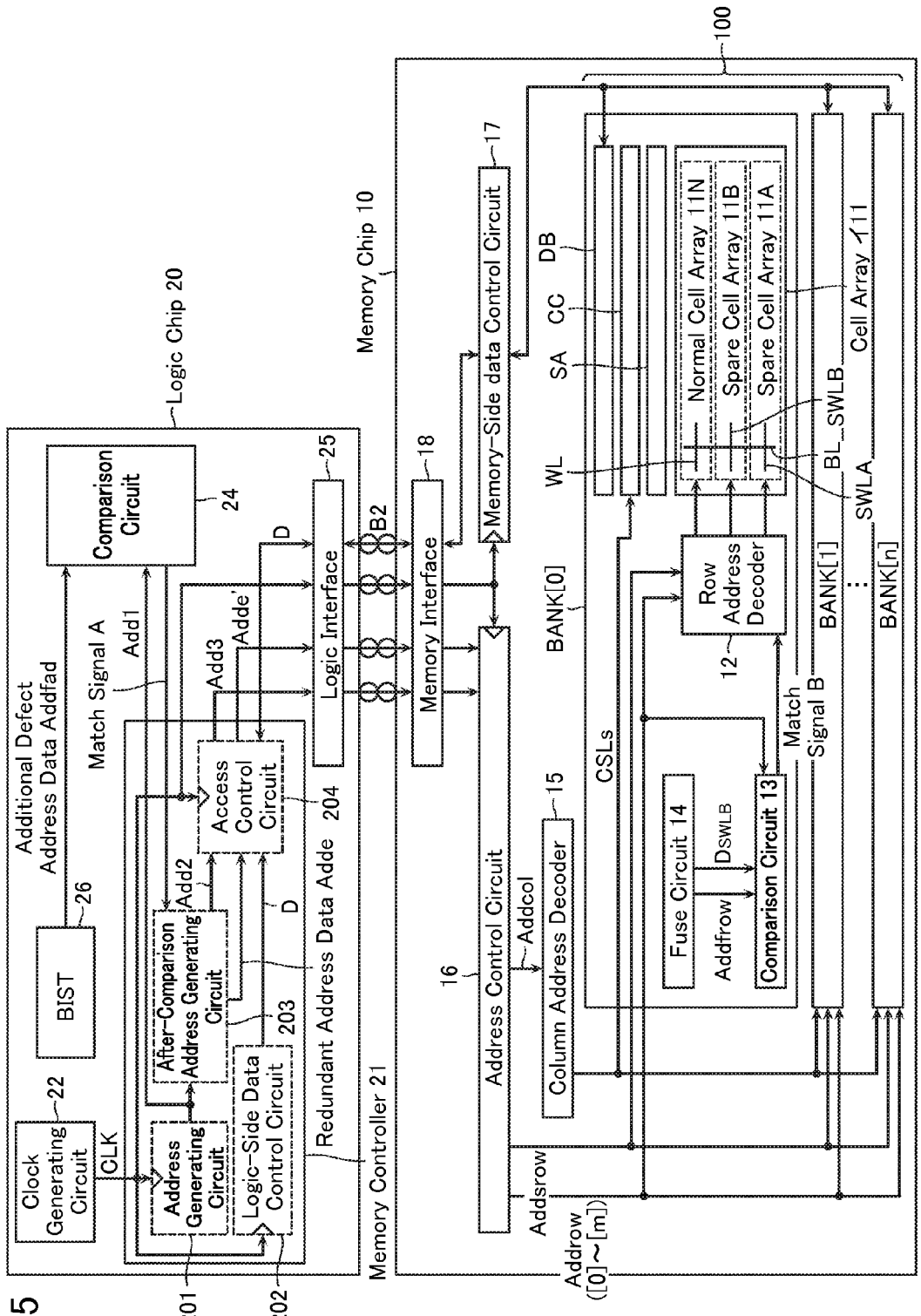
FIG. 15 is a block diagram showing an example of specific configurations of a memory chip 10 and a logic chip 20 included in a semiconductor device 1000 according to a sixth embodiment.
Figure 16:
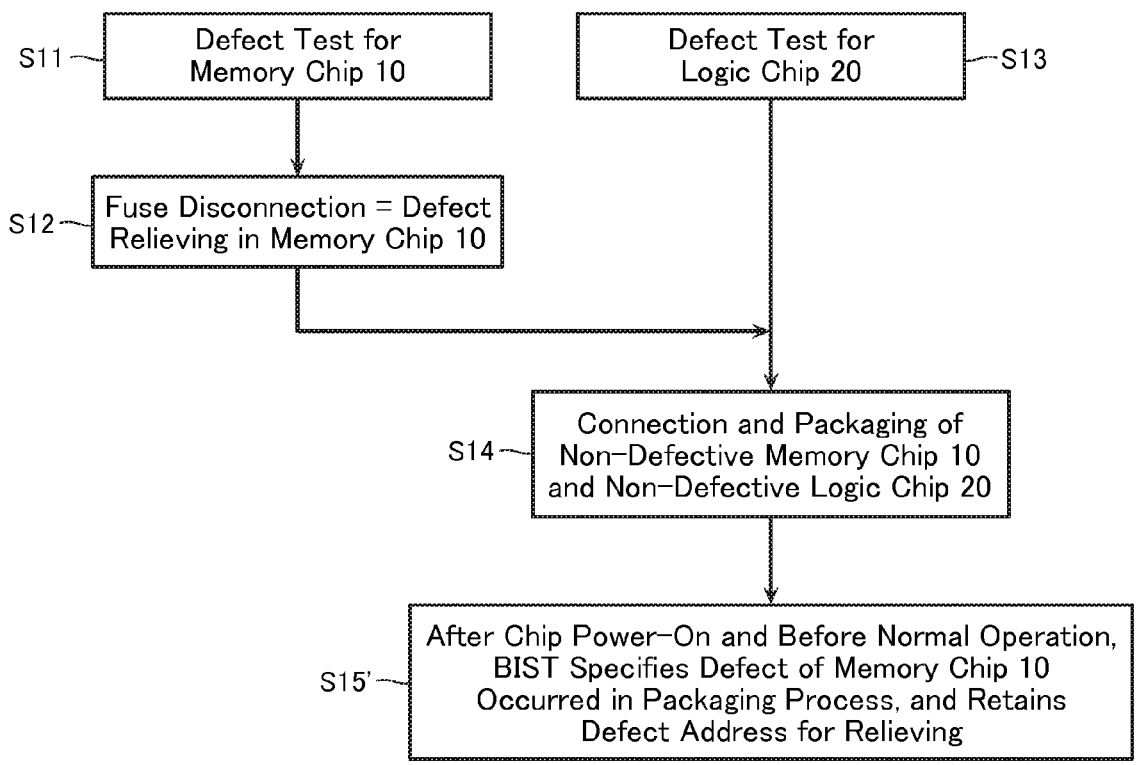
FIG. 16 explains a defective cell relieving procedure of the semiconductor device 1000 according to the sixth embodiment.

Next, a semiconductor device according to the sixth embodiment will be explained with reference to FIG. 15 and FIG. 16. The whole configuration of the present embodiment is the same as the first embodiment (FIG. 1). Furthermore, the configurations of the memory chip 10 and logic chip 20 are substantially the same as the configurations of the first embodiment (FIG. 2) except the following point. In FIG. 15, any components that are the same as the components in FIG. 2 are denoted by the same reference numerals, and hence a detailed explanation about them will not be provided below.

The sixth embodiment is characterized in that the logic chip 20 includes a so-called BIST circuit (Built-in Self Testing circuit) 26 instead of the fuse circuit 23. According to the semiconductor device of the sixth embodiment, after turned on, the semiconductor device 1000 activates the BIST circuit 26 before entering a normal operation, in order to let the BIST circuit 26 specify a defective cell that has occurred in the memory cell array 11 during or after a packaging process and store the address of the defective cell as additional defect address data Addfad. Hence, it is possible to achieve the same effect as that achieved by the embodiments described above. In the present embodiment, the use of the BIST circuit 26, which has been used in the conventional tests for memory chips, eliminates the need for newly adding a fuse circuit 23, which makes it possible to reduce the circuit area. Furthermore, the operation of writing into the fuse circuit 23 becomes unnecessary, which contributes to reducing the test time before shipment.

Next, a defective cell relieving procedure of the semiconductor device 1000 according to the present embodiment will be explained with reference to FIG. 16. Steps S11 to S14 are the same as in the first embodiment. In the present embodiment, at step S15' after step S14, after the semiconductor device is turned on (power on), before a normal operation is entered, the BIST circuit 26 specifies a defective cell that has occurred during or after a packaging process, and retains the address of the defective cell as additional defect address data Addfad. The additional defect address data Addfad is supplied to the comparison circuit 24 as in the embodiments described above.

Seventh Embodiment

Figure 17:
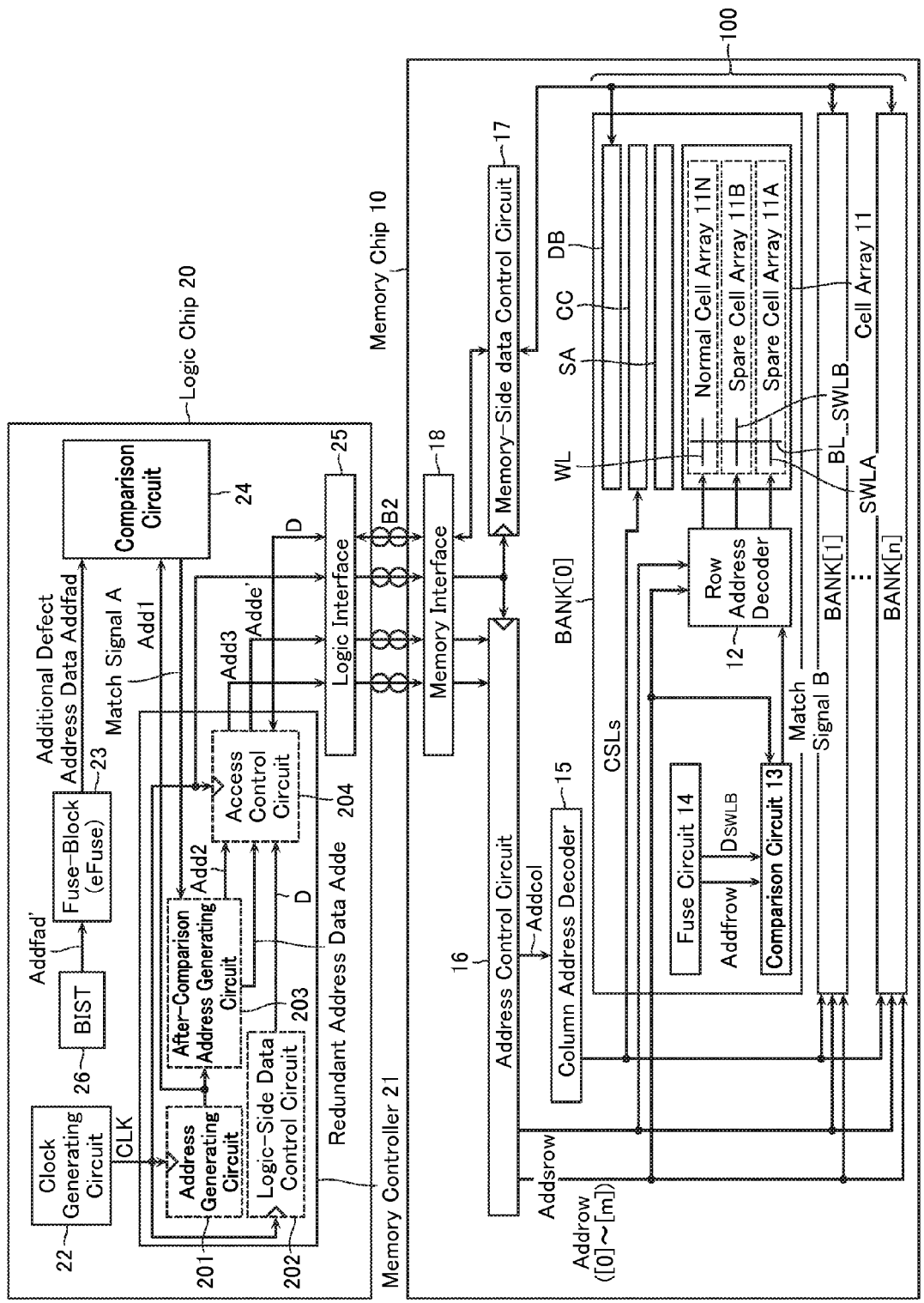
FIG. 17 is a block diagram showing an example of specific configurations of a memory chip 10 and a logic chip 20 included in a semiconductor device 1000 according to a seventh embodiment.

Next, a semiconductor device according to the seventh embodiment will be explained with reference to FIG. 17. The present embodiment is the same as the sixth embodiment except the following point. In the configuration of the seventh embodiment, additional defect address data Addfad' specified by the BIST circuit 26 can be written into the fuse circuit 23 automatically. The present embodiment is the same as the sixth embodiment in the other points. According to this configuration, it is unnecessary to activate the BIST circuit 26 every time the power is turned on, which makes it possible to reduce the time taken for moving from the power-on of the semiconductor device 1000 to a normal operation.

Eighth Embodiment

Figure 18:
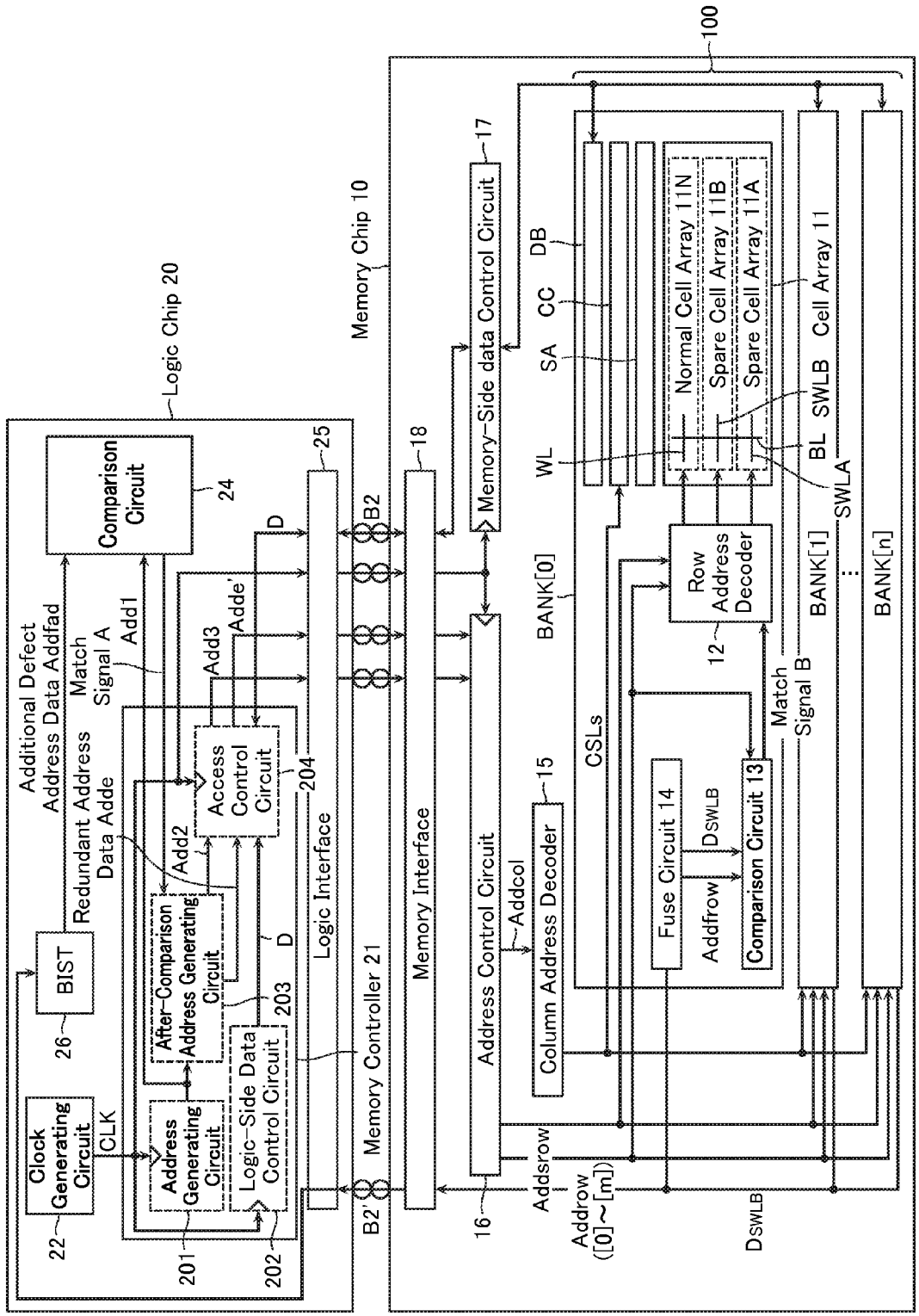
FIG. 18 is a block diagram showing an example of specific configurations of a memory chip 10 and a logic chip 20 included in a semiconductor device 1000 according to an eighth embodiment.

Next, a semiconductor device according to the eighth embodiment will be explained with reference to FIG. 18. The present embodiment is the same as the sixth embodiment except the following point. In the eighth embodiment, the spare word line usage information $D_{SWLB}$ is sent from the fuse circuit 14 of the memory chip 10 to the BIST circuit 26 of the logic chip 20 to be used for testing the memory chip 10 and generating additional defect address data Addfad.

Once the spare word line usage information $D_{SWLB}$ is sent to the BIST circuit 26, the same operation as in the fourth embodiment becomes available. That is, when the spare word line SWLB(6) or SWLB(7) allocated for replacing a defective word line WL that occurs in the normal cell array 11N during or after a packaging process becomes defective, the memory controller 21 can select any other spare word line SWLB than the defective spare word line SWLB based on the received spare word line usage information $D_{SWLB}$.

Ninth Embodiment

Figure 19:
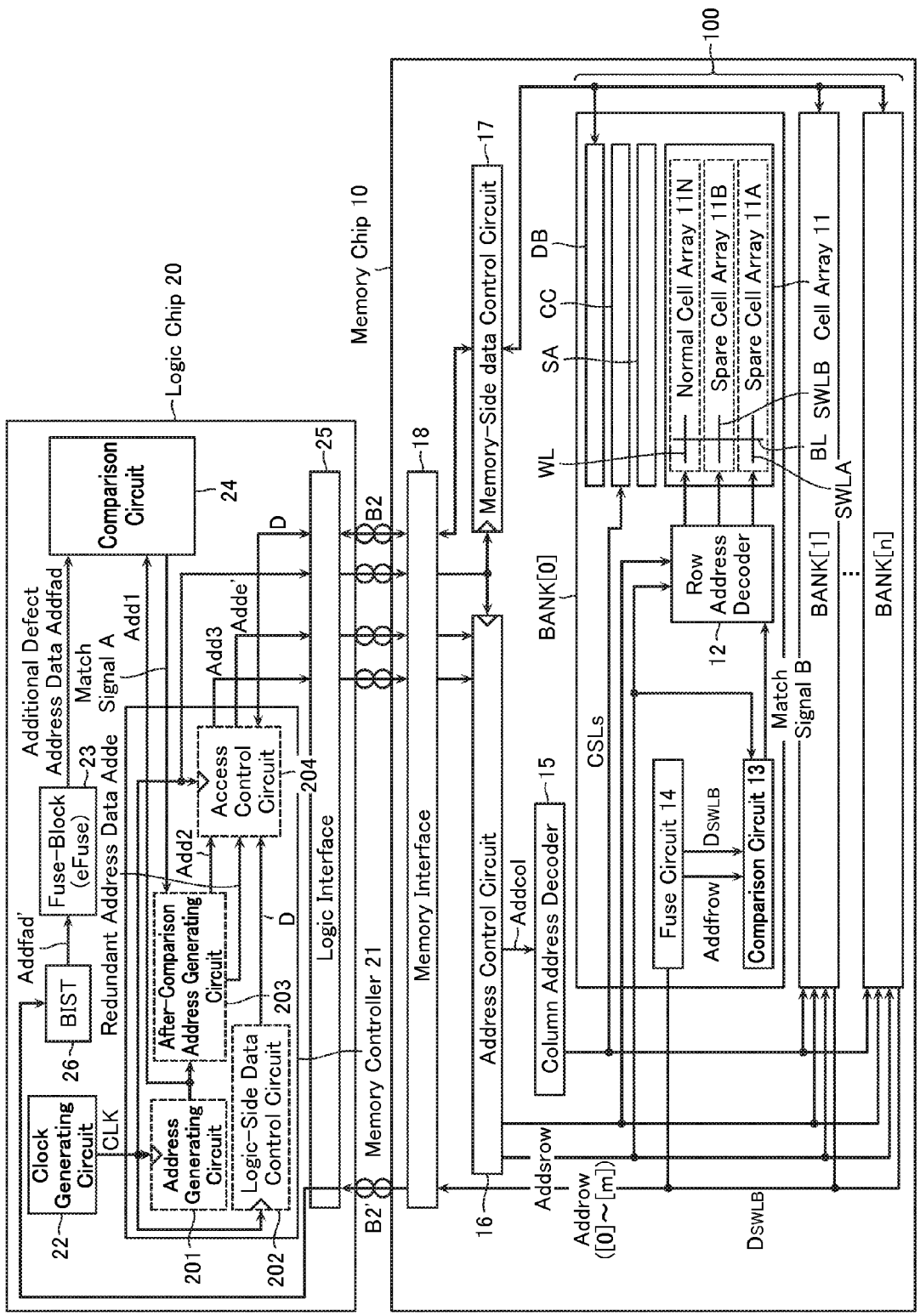
FIG. 19 is a block diagram showing an example of specific configurations of a memory chip 10 and a logic chip 20 included in a semiconductor device 1000 according to a ninth embodiment.

Next, a semiconductor device according to the ninth embodiment will be explained with reference to FIG. 19. In the present embodiment, the spare word line usage information $D_{SWLB}$ is sent from the fuse circuit 14 of the memory chip 10 to the BIST circuit 26 of the logic chip 20 to be used for testing the memory chip 10 and generating additional defect address data Addfad. However, in the present embodiment, both the BIST circuit 26 and the fuse circuit 23 are provided.

Tenth Embodiment

Figure 20:
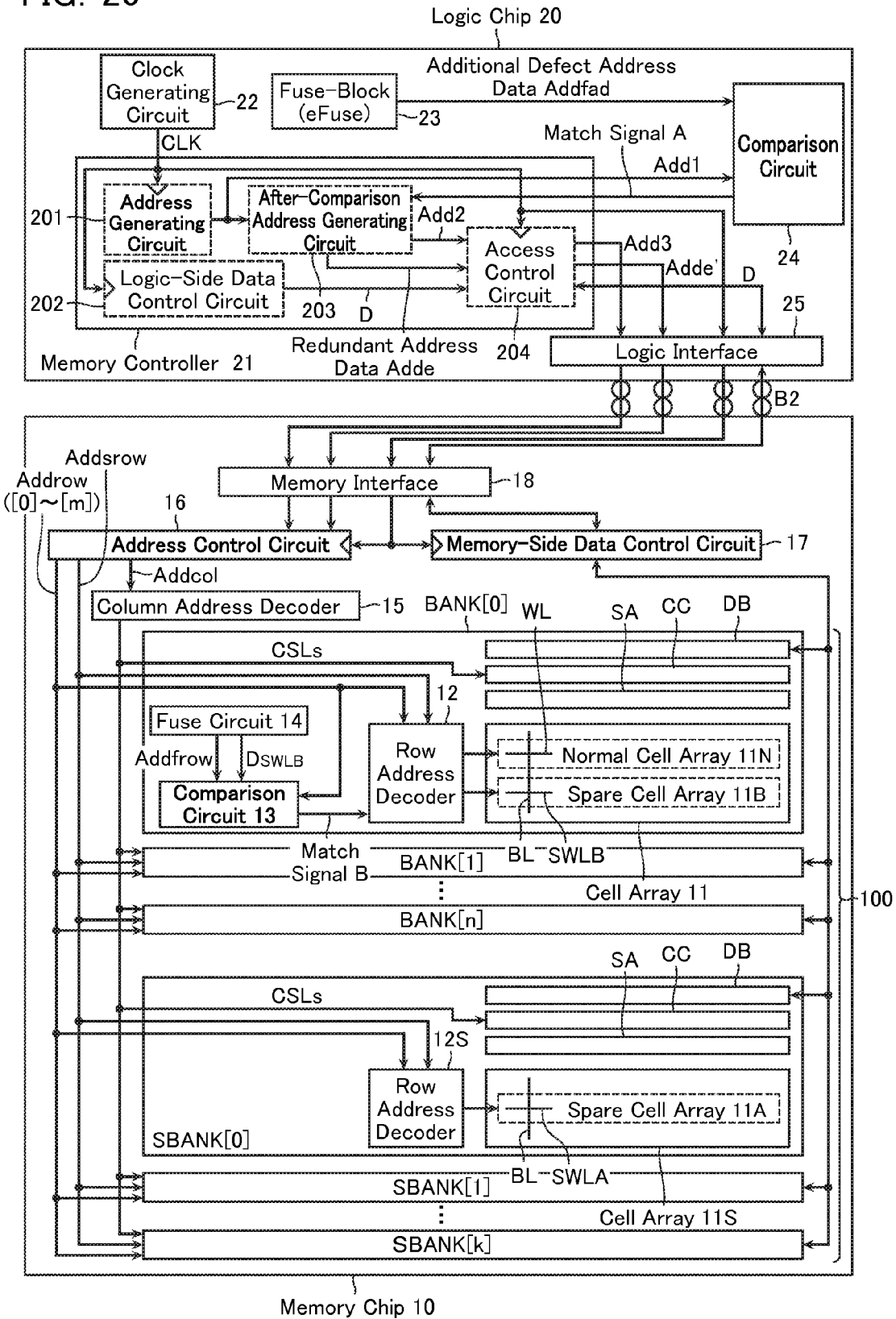
FIG. 20 is a block diagram showing an example of specific configurations of a memory chip 10 and a logic chip 20 included in a semiconductor device 1000 according to a tenth embodiment.

Next, a semiconductor device 1000 according to the tenth embodiment will be explained with reference to FIG. 20. In FIG. 20, any components that are the same as the components in FIG. 2 are denoted by the same reference numerals, and hence a detailed explanation about them will not be provided below. In the present embodiment, spare banks SBANK[0] to SBANK[k] are provided in addition to the banks BANK[0] to BANK[n] (normal banks) which are the same as those in the embodiments described above. The memory cell array 11 in each of the normal banks BANK[0] to BANK[n] includes a normal cell array 11N and one spare cell array 11B used for relieving a defective cell that occurs during a wafer process.

As compared with this, a memory cell array 11S in each of the spare banks SBANK[0] to SBANK[k] includes a spare cell array 11A used for relieving a defective cell that occurs during or after a packaging process. In this way, in the tenth embodiment, the spare cell arrays 11A and 11B are provided in different banks SBANK and BANK, which is the difference from the embodiments described above. In the present embodiment, for example, when a certain normal bank BANK[j] (j=0 to n) includes a defective cell that has occurred during or after a packaging process, the normal cell is relieved by accessing any of the spare banks SBANK instead of the normal bank BANK[j].

Each spare bank SBANK includes a row address decoder 12S.

When address data Add1 and additional defect address data Addfad match in the logic chip 20, the logic chip 20 inputs row address data Addrow[0] to [m] designating a spare word line SWLA in the spare cell array 11A and spare row address data Addsrow.

The row address decoder 12S selects a desired spare word line SWLA based on the row address data Addrow[0] to [m] and the spare row address data Addsrow.

Eleventh Embodiment

Figure 21:
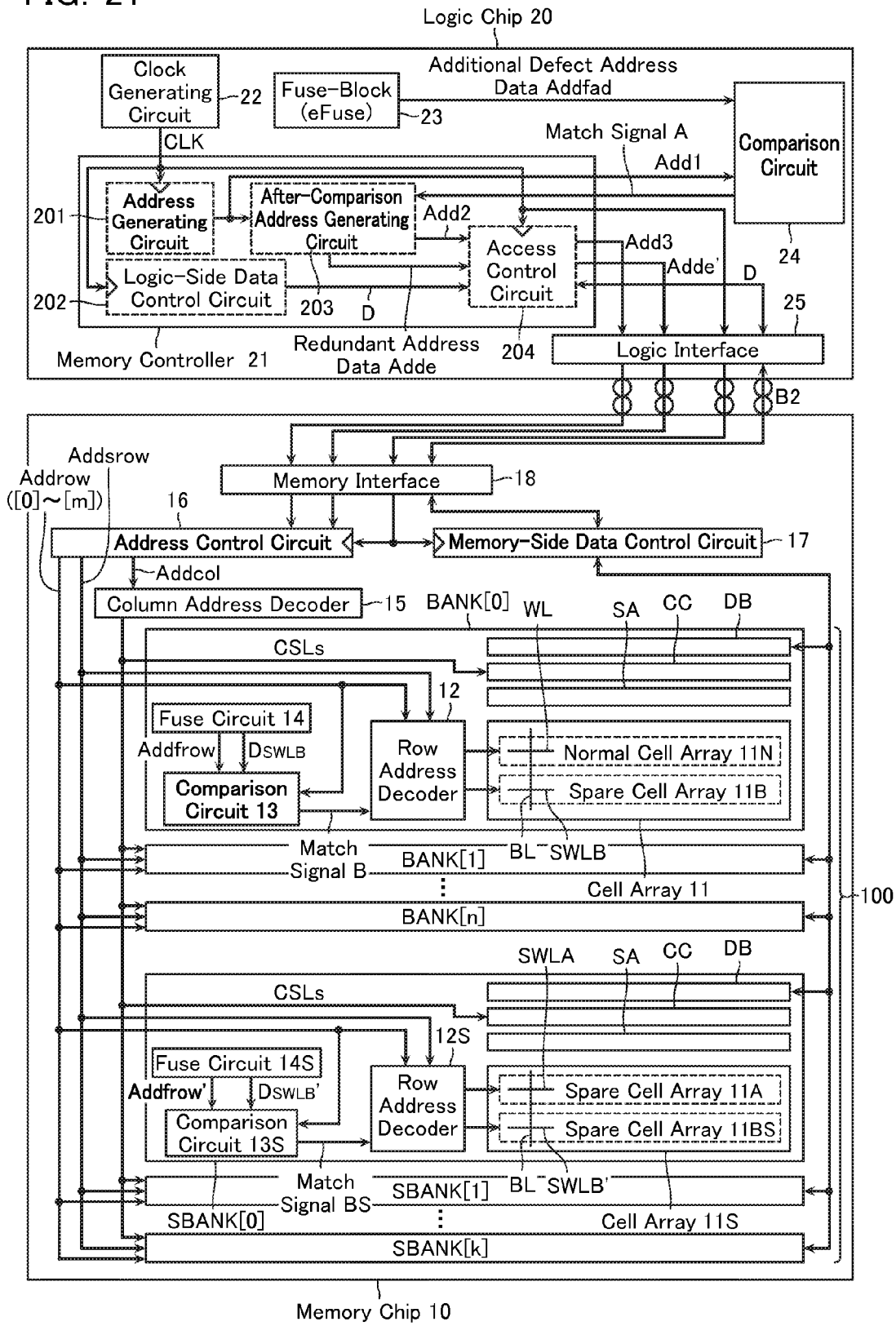
FIG. 21 is a block diagram showing an example of specific configurations of a memory chip 10 and a logic chip 20 included in a semiconductor device 1000 according to an eleventh embodiment.

Next, a semiconductor device according to the eleventh embodiment will be explained with reference to FIG. 21. In FIG. 21, any components that are the same as the components in FIG. 2 are denoted by the same reference numerals, and hence a detailed explanation about them will not be provided below.

In the present embodiment, in addition to the components of the tenth embodiment, a comparison circuit 13S and a fuse circuit 14S are provided in each of the spare banks SBANK in order to relieve a defective spare word line SWLA that occurs in the spare memory cell array 11A during a wafer process. Furthermore, the memory cell array 11S includes a spare cell array 11A and a spare cell array 11BS. The fuse circuit 14S stores defective row address data Addfrow' indicating the address of a defective spare word line SWLA in the spare cell array 11A, and spare word line usage information $D_{SWLB}'$ specifying a spare word line SWLB' among spare word lines SWLB' in the spare cell array 11BS that is used for defect relieving. Row address data Addrow[0] to [m] is input into the comparison circuit 13S, and compared with the defective row address data Addfrow'. When the row address data Addrow[0] to [m] matches with any defective row address data Addfrow', the comparison circuit 13S outputs a match signal BS. Based on the match signal BS, the row decoder 12S selects a desired spare word line SWLB' instead of the spare word line SWLA that is designated by the row address data Addrow[0] to [m] and spare row address data Addsrow. The present embodiment is the same as the tenth embodiment in the other points.

Twelfth Embodiment

Figure 22:
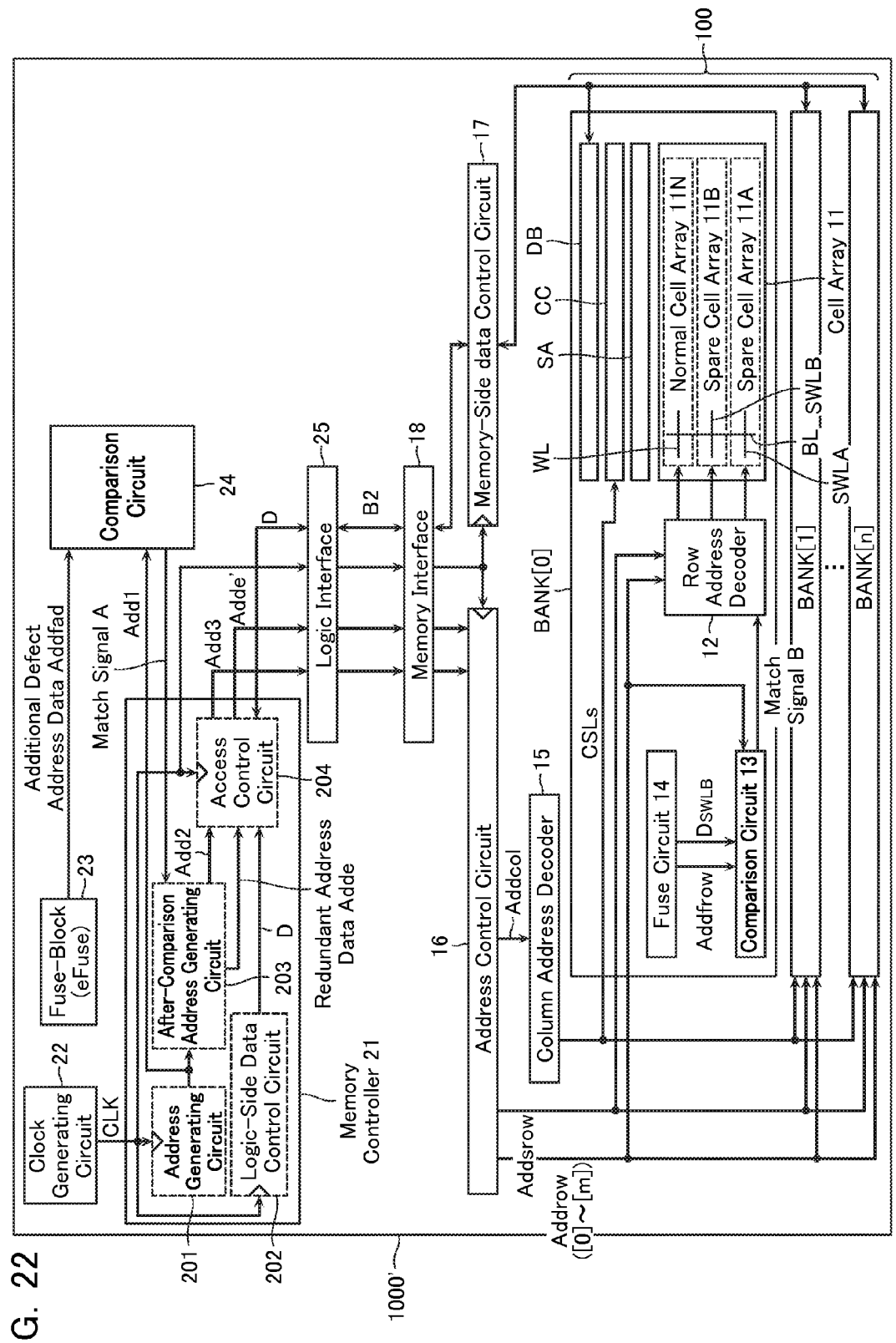
FIG. 22 is a block diagram showing an example of specific configurations of a memory chip 10 and a logic chip 20 included in a semiconductor device 1000 according to a twelfth embodiment.

Next, a semiconductor device according to the twelfth embodiment will be explained with reference to FIG. 22. In FIG. 22, any components that are the same as the components in FIG. 2 are denoted by the same reference numerals, and hence a detailed explanation about them will not be provided below. In the present embodiment, a mixed-mounted memory system (System on Chip: SoC) in which the functions of the logic chip 20 and the functions of the memory chip 10 are mounted on the same wafer is employed. Various circuits having the functions of the logic chip 20 are the same as the circuits on the logic chip 20, and the same is true for the memory chip 10. This configuration can also achieve the same effect as that achieved by the embodiments described above.

Though some embodiments of the present invention have been described, these embodiments are presented by way of example, and are not intended to limit the scope of the invention. These novel embodiments can be implemented in various other forms, and various omissions, substitutions, and changes can be made thereonto without departing from the spirit of the invention. These embodiments and modifications thereof are included in the meaning and scope of the invention, and included in scope of the inventions set forth in the claims and their equivalents.

For example, in the embodiments described above, a row redundancy scheme of replacing a word line connected to a defective cell with another word line has been explained. However, the present invention may also be applied when a column redundancy scheme is employed instead.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first semiconductor chip including a semiconductor memory device and provided in a package;
a second semiconductor chip including a control circuit configured to control the semiconductor memory device and provided in the package;
the first semiconductor chip including:
a memory cell array including a normal cell array configured by arranging memory cells at intersections of a plurality of first lines and a plurality of second lines, and a spare cell array configured by arranging spare cells for replacing the normal cell array;
a first defect address data output circuit configured to output first defect address data indicating an address of a defective memory cell in the memory cell array;
a first comparison circuit configured to compare address data indicating an address of a memory cell with the first defect address data to output a first match signal in case of matching; and
a decoder configured to decode the address data to select the memory cell in the normal cell array, or, when the first match signal is output, to select a first spare cell in the spare cell array instead of the memory cell in the normal cell array,
the second semiconductor chip including:
the control circuit configured to control an operation of the first semiconductor chip;
a second defect address data output circuit configured to output second defect address data indicating an address of a defective memory cell in the memory cell array; and
a second comparison circuit configured to compare the address data with the second defect address data to output a second match signal in case of matching,
wherein the decoder is configured to select a second spare cell in the spare cell array when the second match signal is output.

2. The semiconductor device according to claim 1, wherein the second defect address data output circuit is a fuse circuit configured to be capable of being written with the second defect address data after sealing by the package.

3. The semiconductor device according to claim 1, wherein the first defect address data output circuit is a fuse circuit configured to be capable of being written with the first defect address data before sealing by the package.

4. The semiconductor device according to claim 1, wherein the second semiconductor chip further includes an address generating circuit configured to newly generate address data indicating an address in the spare cell array based on the address data when the second match signal is output.

5. The semiconductor device according to claim 1, wherein the first defect address data output circuit retains defect address data about the normal cell array and defect address data about the spare cell array as the first defect address data.

6. The semiconductor device according to claim 1, wherein the first defect address data output circuit retains line usage information specifying a usable first line among a plurality of first lines in the spare cell array.

7. The semiconductor device according to claim 1, wherein the first defect address data output circuit retains, as the first defect address data, defect address data about the normal cell array, defect address data about the spare cell array, and line usage information specifying a usable first line among a plurality of first lines in the spare cell array.

8. The semiconductor device according to claim 1, wherein the first defect address data output circuit is a first fuse circuit configured to be capable of being written with the first defect address data before sealing by the package, and
the second defect address data output circuit is a second fuse circuit configured to be capable of being written with the second defect address data after sealing by the package.

9. The semiconductor device according to claim 8,
wherein the second semiconductor chip further includes an address generating circuit configured to newly generate address data indicating an address in the spare cell array based on the address data when the second match signal is output.

10. The semiconductor device according to claim 8,
wherein the first defect address data output circuit retains defect address data about the normal cell array and defect address data about the spare cell array as the first defect address data.

11. The semiconductor device according to claim 8,
wherein the first defect address data output circuit retains line usage information specifying a usable first line among a plurality of first lines in the spare cell array.

12. The semiconductor device according to claim 1,
wherein the second defect address data output circuit is a BIST circuit.

13. The semiconductor device according to claim 12, further comprising a fuse circuit configured to retain defect address data specified based on a test performed by the BIST circuit.

14. The semiconductor device according to claim 12,
wherein the first defect address data output circuit retains line usage information specifying a usable first line among a plurality of first lines in the spare cell array, and the line usage information is sent to the BIST circuit.

15. The semiconductor device according to claim 1,
wherein the first semiconductor chip includes a normal bank and a spare bank,
the normal bank includes the normal cell array and a first spare cell array, and
the spare bank includes a second spare cell array.

16. The semiconductor device according to claim 15,
wherein the second semiconductor chip further includes an address generating circuit configured to newly generate address data indicating an address in the spare cell array based on the address data when the second match signal is output.

17. The semiconductor device according to claim 15,
wherein the first defect address data output circuit retains defect address data about the normal cell array and defect address data about the spare cell array as the first defect address data.

18. A defect relieving method for a semiconductor device comprising: a first semiconductor chip including a semiconductor memory device and provided in a package; and a second semiconductor chip including a control circuit configured to control the semiconductor memory device and provided in the package, the method comprising:
performing a defect test on the first semiconductor chip and storing first defect address data indicating an address of a defective memory cell included in the first semiconductor chip in the first semiconductor chip;
sealing the first semiconductor chip and the second semiconductor chip in a same package;
storing second defect address data indicating an address of a defective memory cell included in the first semiconductor chip in the second semiconductor chip;
comparing address data indicating an address of a memory cell with the first defect address data to output a first match signal in case of matching;
comparing the address data with the second defect address data to output a second match signal in case of matching; and
decoding address data to select a memory cell in a normal cell array, or when the first match signal or the second match signal is output, to select a memory cell in a spare cell array instead of a memory cell in the normal cell array.

19. The defect relieving method according to claim 18,
wherein the second defect address data is stored in the second semiconductor chip after sealing by the package.

20. The defect relieving method according to claim 18,
wherein the second semiconductor chip newly generates within the second semiconductor chip, address data indicating an address in the spare cell array based on the address data, when the second match signal is output.

* * * * *